US012652866B2

(12) United States Patent
Shen et al.

(10) Patent No.: US 12,652,866 B2
(45) Date of Patent: Jun. 9, 2026

(54) APD, APD FABRICATION METHOD, DETECTOR, AND LASER RADAR SYSTEM

(71) Applicant: Huawei Technologies Co., Ltd., Shenzhen (CN)

(72) Inventors: Hongming Shen, Shenzhen (CN); Yanli Zhao, Wuhan (CN); Yun Ding, Wuhan (CN); Dapan Li, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 395 days.

(21) Appl. No.: 18/506,294

(22) Filed: Nov. 10, 2023

(65) Prior Publication Data

US 2024/0079512 A1    Mar. 7, 2024

Related U.S. Application Data

(63) Continuation of application No. PCT/CN2022/088292, filed on Apr. 21, 2022.

(30) Foreign Application Priority Data

May 11, 2021    (CN) ......................... 202110513633.2

(51) Int. Cl.
    *H10F 30/225*        (2025.01)
    *G01S 7/292*         (2006.01)
                (Continued)
(52) U.S. Cl.
    CPC ............ *H10F 30/225* (2025.01); *G01S 7/292* (2013.01); *G01S 13/89* (2013.01); *H10F 77/1248* (2025.01)

(58) Field of Classification Search
    CPC ........ G01S 7/292; G01S 13/89; G01S 7/4816; G01S 17/10; G01S 7/4865; G01S 17/894;
                (Continued)

(56) References Cited

U.S. PATENT DOCUMENTS 11,101,399 B1 *   8/2021   Shi ...................... H10F 77/1248
2002/0074555 A1   6/2002   Kim et al.
                (Continued)

OTHER PUBLICATIONS

Yi-Han Chen et al, "Top-Illuminated In 0.52Al0.48As-Based Avalanche Photodiode With Dual Charge Layers for High-Speed and Low Dark Current Performances," IEEE Journal of Selected Topics in Quantum Electronics, vol. 24, No. 2, Mar. / Apr. 2018, total 8 pages.
                (Continued)

*Primary Examiner* — Fernando L Toledo
*Assistant Examiner* — Adam S Bowen
(74) *Attorney, Agent, or Firm* — Conley Rose, P.C.

(57)        ABSTRACT

An avalanche photodiode (APD) includes a first electrode, a substrate layer, a buffer layer, a gain layer, a gradient layer, an absorption layer, a diffusion barrier layer, a contact layer, and a second electrode. The gain layer, the gradient layer, and the absorption layer are arranged vertically in sequence. The gain layer, the gradient layer, and the absorption layer are located between the buffer layer and the diffusion barrier layer. The gain layer includes at least two gain units, and the gain units are arranged in a stacked manner. Each of the gain units includes a multiplication layer and a charge layer that are arranged vertically. A distance between the charge layer and the gradient layer is less than a distance between the multiplication layer and the gradient layer.

20 Claims, 16 Drawing Sheets

(51) Int. Cl.
    *G01S 13/89*         (2006.01)
    *H10F 77/124*      (2025.01)

(58) Field of Classification Search
    CPC ............. H10F 77/1248; H10F 71/1272; H10F
                 30/2255; H10F 77/122; H10F 77/147;
                        H10F 77/241; H10F 71/127
    See application file for complete search history.

(56)                 References Cited

U.S. PATENT DOCUMENTS

| | | | |
|---|---|---|---|
| 2016/0372623 A1* | 12/2016 | Bank ................... | H10F 77/1248 |
| 2017/0244002 A1* | 8/2017 | Campbell ........... | H10F 30/2255 |
| 2021/0013357 A1* | 1/2021 | Liang ................. | H10F 71/1272 |
| 2022/0074555 A1* | 3/2022 | Hong ........................ | F21V 3/00 |

OTHER PUBLICATIONS

Guipeng Liu et al, "A theory study of the multiplication characteristics of InP/InGaAs avalanche photodiodes with double multiplication layers and double charge layers," May 2, 2016, pp. 114-118, XP029554164.
Guipeng Liu et al, "Modeling a novel InP/InGaAs avalanche photodiode structure: Reducing the excess noise factor," Nov. 29, 2018, pp. 374-377, XP093205618.

* cited by examiner

507

508 & 509

510

Reverse bias voltage (V)

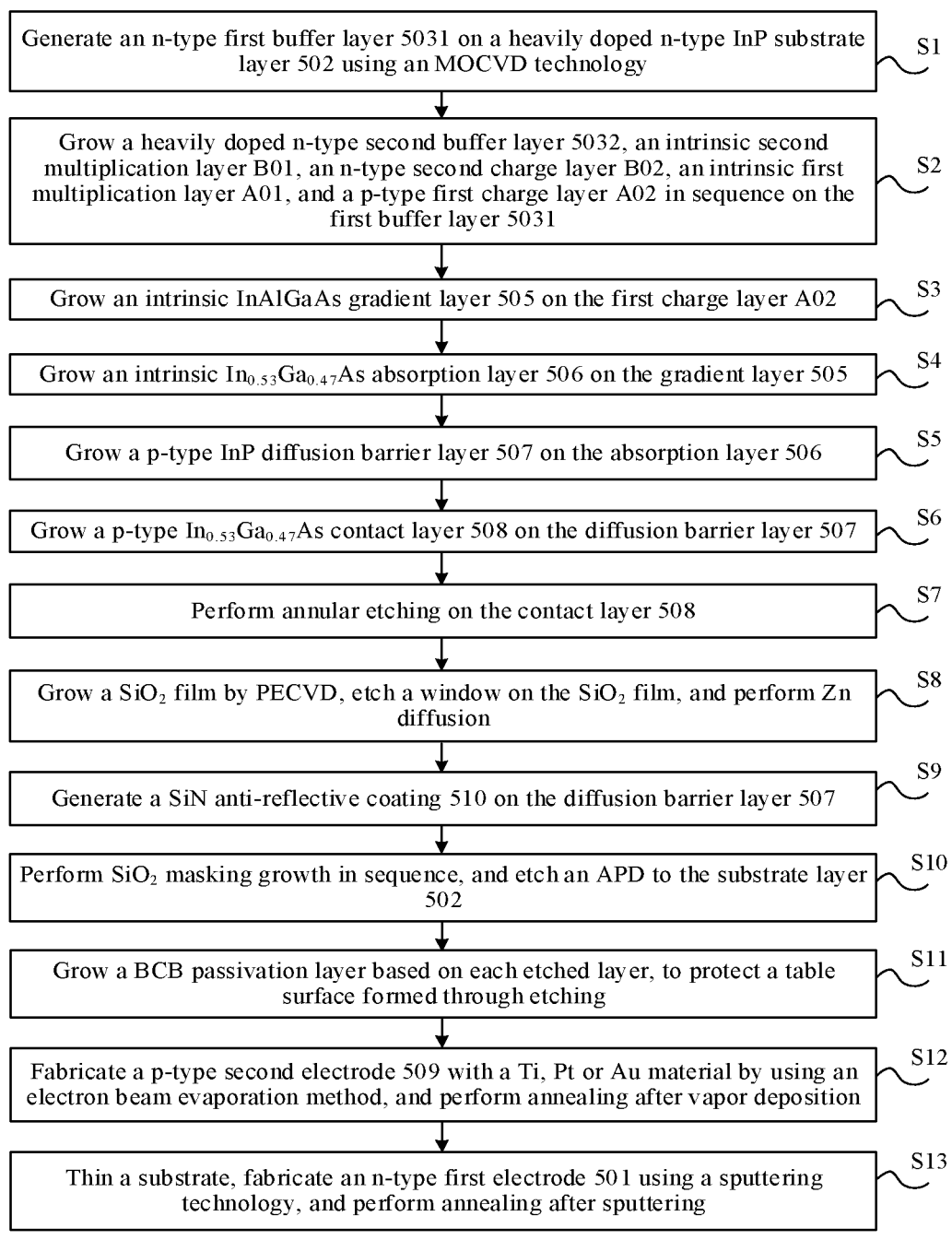

| Generate an n-type first buffer layer 5031 on a heavily doped n-type InP substrate layer 502 using an MOCVD technology | S1 |

| Grow a heavily doped n-type second buffer layer 5032, an intrinsic second multiplication layer B01, an n-type second charge layer B02, an intrinsic first multiplication layer A01, and a p-type first charge layer A02 in sequence on the first buffer layer 5031 | S2 |

| Grow an intrinsic InAlGaAs gradient layer 505 on the first charge layer A02 | S3 |

| Grow an intrinsic $In_{0.53}Ga_{0.47}As$ absorption layer 506 on the gradient layer 505 | S4 |

| Grow a p-type InP diffusion barrier layer 507 on the absorption layer 506 | S5 |

| Grow a p-type $In_{0.53}Ga_{0.47}As$ contact layer 508 on the diffusion barrier layer 507 | S6 |

| Perform annular etching on the contact layer 508 | S7 |

| Grow a $SiO_2$ film by PECVD, etch a window on the $SiO_2$ film, and perform Zn diffusion | S8 |

| Generate a SiN anti-reflective coating 510 on the diffusion barrier layer 507 | S9 |

| Perform $SiO_2$ masking growth in sequence, and etch an APD to the substrate layer 502 | S10 |

| Grow a BCB passivation layer based on each etched layer, to protect a table surface formed through etching | S11 |

| Fabricate a p-type second electrode 509 with a Ti, Pt or Au material by using an electron beam evaporation method, and perform annealing after vapor deposition | S12 |

| Thin a substrate, fabricate an n-type first electrode 501 using a sputtering technology, and perform annealing after sputtering | S13 |

FIG. 11

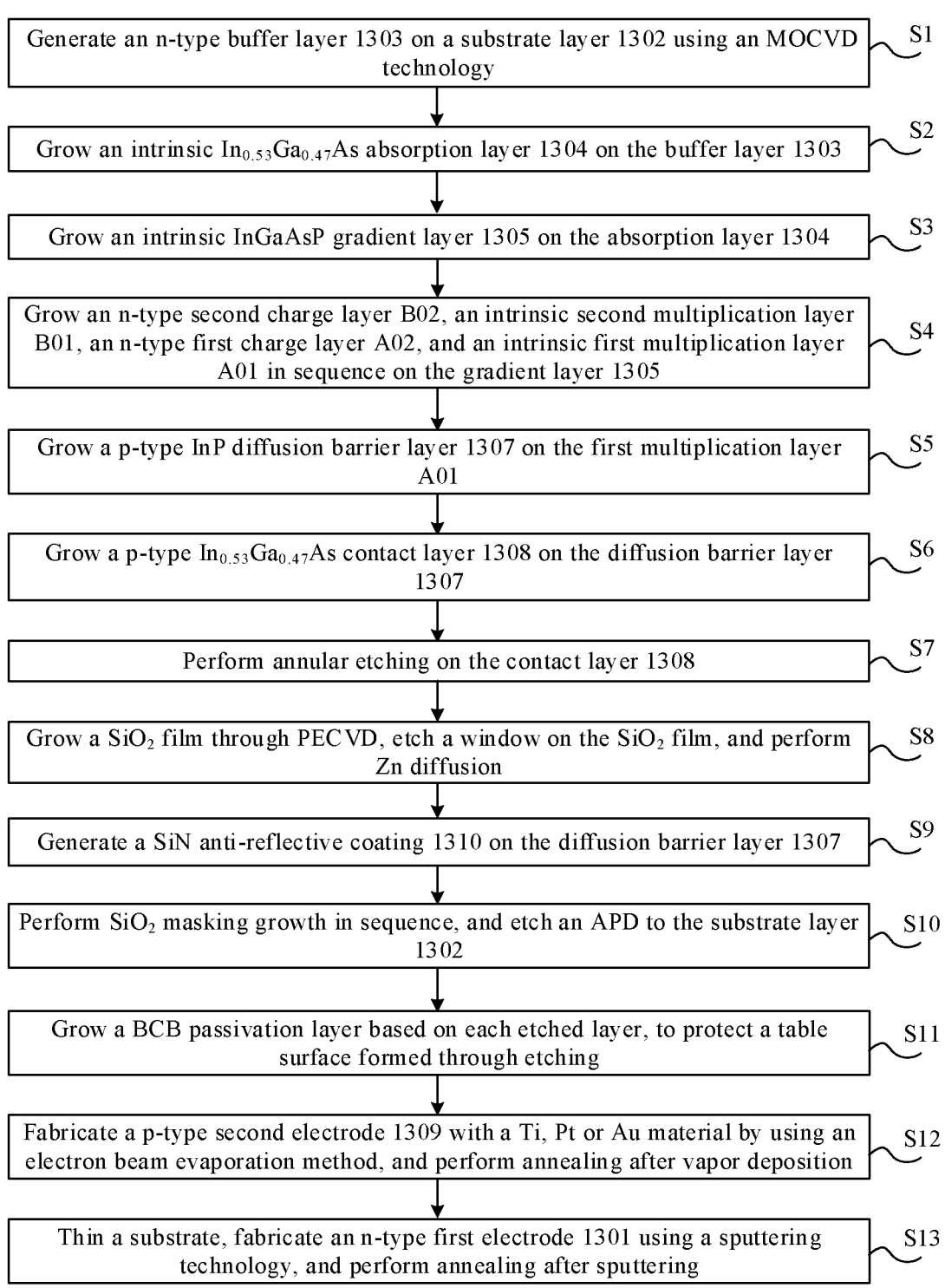

Generate an n-type buffer layer 1303 on a substrate layer 1302 using an MOCVD technology — S1

Grow an intrinsic $In_{0.53}Ga_{0.47}As$ absorption layer 1304 on the buffer layer 1303 — S2

Grow an intrinsic InGaAsP gradient layer 1305 on the absorption layer 1304 — S3

Grow an n-type second charge layer B02, an intrinsic second multiplication layer B01, an n-type first charge layer A02, and an intrinsic first multiplication layer A01 in sequence on the gradient layer 1305 — S4

Grow a p-type InP diffusion barrier layer 1307 on the first multiplication layer A01 — S5

Grow a p-type $In_{0.53}Ga_{0.47}As$ contact layer 1308 on the diffusion barrier layer 1307 — S6

Perform annular etching on the contact layer 1308 — S7

Grow a $SiO_2$ film through PECVD, etch a window on the $SiO_2$ film, and perform Zn diffusion — S8

Generate a SiN anti-reflective coating 1310 on the diffusion barrier layer 1307 — S9

Perform $SiO_2$ masking growth in sequence, and etch an APD to the substrate layer 1302 — S10

Grow a BCB passivation layer based on each etched layer, to protect a table surface formed through etching — S11

Fabricate a p-type second electrode 1309 with a Ti, Pt or Au material by using an electron beam evaporation method, and perform annealing after vapor deposition — S12

Thin a substrate, fabricate an n-type first electrode 1301 using a sputtering technology, and perform annealing after sputtering — S13

FIG. 14

APD, APD FABRICATION METHOD, DETECTOR, AND LASER RADAR SYSTEM

CROSS-REFERENCE TO RELATED APPLICATIONS

This application is a continuation application of International Patent Application No. PCT/CN2022/088292, filed on Apr. 21, 2022, which claims priority to Chinese Patent Application No. 202110513633.2, filed on May 11, 2021. The disclosures of the aforementioned applications are hereby incorporated by reference in their entireties.

TECHNICAL FIELD

This application relates to the field of semiconductor device technologies, and in particular, to an avalanche photodiode (APD), an APD fabrication method, a detector, and a laser radar system.

BACKGROUND

An APD is characterized by high bandwidth and a low dark current, and is often used in fields including optical communication, array imaging systems, single photon detection, and the like. For example, in a pulsed time-of-flight (TOF) laser radar system for ultra-long range detection, the APD may be used as a detector for the pulsed TOF laser radar system.

FIG. 1 is a schematic diagram of a structure of an APD in the conventional technology. As shown in FIG. 1, the APD may include a substrate 101, a buffer layer 102, an absorption layer 103, a gradient transition layer 104, a charge layer 105, a multiplication layer 106, and a contact layer 107. The substrate 101, the buffer layer 102, the charge layer 105, the multiplication layer 106, and the contact layer 107 are generated by using an indium phosphide (InP) material. The absorption layer 103 is generated by using an indium gallium arsenide (InGaAs) material. The gradient transition layer 104 is generated by using InGaAsP material. FIG. 2 is a schematic diagram of distribution of electric field strength corresponding to each layer in an APD as a distance between each layer and a contact layer 107 changes. The absorption layer 103 may generate a photo-generated carrier, and collision ionization occurs under an action of relatively high electric field strength of the multiplication layer 106, to implement an internal gain.

However, with reference to FIG. 3, the APD can obtain a high gain only when a reverse bias voltage reaches a breakdown point of the APD. The APD is temperature-sensitive. When a temperature of the APD changes, a breakdown voltage of the APD also changes due to impact of temperature drift, and a gain of the APD also changes. Because a slope of a gain curve of the APD is relatively high when the APD is near the breakdown point, the gain of the APD changes sharply when the temperature changes, leading to severe impact on performance.

SUMMARY

This application provides an APD, an APD fabrication method, a detector, and a laser radar system, to resolve a problem that performance of the APD is severely affected when a temperature of the APD changes in the conventional technology.

To achieve the foregoing objective, the following technical solutions are used in this application.

According to a first aspect, an avalanche photodiode APD is provided. The APD includes a first electrode, a substrate layer, a buffer layer, a gain layer, a gradient layer, an absorption layer, a diffusion barrier layer, a contact layer, and a second electrode. The first electrode, the substrate layer, the buffer layer, the diffusion barrier layer, the contact layer, and the second electrode are disposed from bottom to top.

The gain layer, the gradient layer, and the absorption layer are arranged vertically in sequence. The gain layer, the gradient layer, and the absorption layer are located between the buffer layer and the diffusion barrier layer.

The gain layer includes at least two gain units, and the gain units are arranged in a stacked manner.

Each of the gain units includes a multiplication layer and a charge layer that are vertically arranged, and a distance between the charge layer and the gradient layer is less than a distance between the multiplication layer and the gradient layer.

A plurality of multiplication layers and a plurality of charge layers are controlled to form a gain flattening region of the APD. This may improve temperature stability of the APD, reduce temperature drift of the APD, and reduce a gain change degree of the APD when a temperature changes, thereby improving reliability of the APD.

In a first possible implementation of the first aspect, a distance between the gain layer and the buffer layer is less than a distance between the gradient layer and the buffer layer.

The buffer layer and the gradient layer are disposed on two sides of the gain layer, so that an electron-type APD may be formed. An electron may then be used as a carrier of the APD, thereby improving flexibility of the APD.

Based on the first possible implementation of the first aspect, in a second possible implementation of the first aspect, the at least two gain units include a first gain unit and a second gain unit. A distance between the second gain unit and the gradient layer is greater than a distance between the first gain unit and the gradient layer.

The first gain unit includes a first multiplication layer and a first charge layer. The second gain unit includes a second multiplication layer and a second charge layer.

Based on the second possible implementation of the first aspect, in a third possible implementation of the first aspect, the first charge layer is generated by using a p-type indium arsenide (InAlAs) material or a p-type InP material. The second charge layer is generated by using an n-type (InAlAs) material or an n-type InP material. The first multiplication layer and the second multiplication layer are both generated by using an intrinsic InGaAs material or an intrinsic InP material.

Alternatively, the first charge layer is generated by using a p-type silicon (Si) material. The second charge layer is generated by using an n-type Si material, and the first multiplication layer and the second multiplication layer are both generated by using an intrinsic Si material or an intrinsic germanium (Ge) material.

The p-type doped first charge layer and the n-type doped second charge layer may implement precise control over an electric field inside the APD and a gain of the APD. In combination with control over a thickness of the first multiplication layer, this may effectively increase the gain of the APD. Electric field strength of the first multiplication layer and electric field strength of the second multiplication layer are then controlled, so that the electric field strength of the second multiplication layer is less than the electric field strength of the first multiplication layer. The gain flattening region of the APD may be formed.

In a fourth possible implementation of the first aspect, a distance between the gain layer and the buffer layer is greater than a distance between the gradient layer and the buffer layer.

The buffer layer and the gradient layer are disposed on two sides of the absorption layer, so that an electron hole-type APD may be formed. An electron hole may then be used as a carrier of the APD, thereby improving flexibility of the APD.

Based on the fourth possible implementation of the first aspect, in a fifth possible implementation of the first aspect, the at least two gain units include a first gain unit and a second gain unit. A distance between the second gain unit and the gradient layer is less than a distance between the first gain unit and the gradient layer.

The first gain unit includes a first multiplication layer and a first charge layer. The second gain unit includes a second multiplication layer and a second charge layer.

Based on the fifth possible implementation of the first aspect, in a sixth possible implementation of the first aspect, the first charge layer and the second charge layer are both generated by using an n-type InAlAs material or an n-type InP material. The first multiplication layer and the second multiplication layer are both generated by using an intrinsic InAlAs material or an intrinsic InP material.

Alternatively, the first charge layer and the second charge layer are both generated by using an n-type Si material. The first multiplication layer and the second multiplication layer are both generated by using an intrinsic Si material or an intrinsic Ge material.

The n-type doped first charge layer and the second charge layer may implement precise control over an electric field inside the APD and a gain of the APD. In combination with control over a thickness of the first multiplication layer, this may effectively increase the gain of the APD. Electric field strength of the first multiplication layer and electric field strength of the second multiplication layer are then controlled, so that the electric field strength of the second multiplication layer is less than the electric field strength of the first multiplication layer. The gain flattening region of the APD may be formed.

Based on any one of the second, third, fifth, and sixth possible implementations of the first aspect, in a seventh possible implementation of the first aspect, the gain unit further includes a third gain unit. A distance between the third gain unit and the first gain unit is greater than a distance between the second gain unit and the first gain unit.

The third gain unit includes a third multiplication layer and a third charge layer. The third charge layer is generated by using an n-type material. The third multiplication layer is generated by using an intrinsic material.

By disposing a plurality of gain units in the APD, the plurality of multiplication layers and the plurality of charge layers may be obtained. The gain of the APD and internal electric field strength of the APD may be controlled conveniently and more accurately by using the plurality of multiplication layers and the plurality of charge layers, so that a gain flattening region that better matches an application scenario may be obtained, and the reliability of the APD is improved.

Based on any one of the foregoing possible implementations of the first aspect, in an eighth possible implementation of the first aspect, the contact layer and the second electrode are of an annular structure. A projection of the contact layer on the diffusion barrier layer coincides with a projection of the second electrode on the diffusion barrier layer.

Based on any one of the foregoing possible implementations of the first aspect, in a ninth possible implementation of the first aspect, the APD further includes an anti-reflective coating.

The anti-reflective coating is located on a side that is of the diffusion barrier layer and that is close to the second electrode.

The contact layer and the second electrode are of the annular structure. The projection of the contact layer on the diffusion barrier layer coincides with the projection of the second electrode on the diffusion barrier layer. The anti-reflective coating is located in the annular structure formed by the contact layer and the second electrode.

A loss of an echo pulse may be reduced by disposing the annular structure and the anti-reflective coating. The APD may obtain a more accurate electrical signal based on more echo pulses.

Based on any one of the foregoing possible implementations of the first aspect, in a tenth possible implementation of the first aspect, the buffer layer includes a first buffer layer and a second buffer layer that are vertically arranged. A distance between the first buffer layer and the substrate layer is less than a distance between the second buffer layer and the substrate layer. A material of the first buffer layer is inconsistent with a material of the second buffer layer. The material of the first buffer layer is consistent with a material of the substrate layer.

A defect may be reduced by lattice match between the first buffer layer and the substrate layer. The second buffer layer is configured to eliminate a memory effect of the substrate layer and the first buffer layer in a growth process, so that the second multiplication layer may grow better.

Based on any one of the foregoing possible implementations of the first aspect, in an eleventh possible implementation of the first aspect, the substrate layer and the buffer layer are generated by using the n-type material. The gradient layer and the absorption layer are generated by using the intrinsic material. The diffusion barrier layer and the contact layer are generated by using a p-type material.

Based on any one of the foregoing possible implementations of the first aspect, in a twelfth possible implementation of the first aspect, if the first charge layer and the second charge layer are both generated by using a Si material, and the first multiplication layer and the second multiplication layer are both generated by using the intrinsic Si material or the intrinsic Ge material, the substrate layer, the buffer layer, the diffusion barrier layer, and the contact layer are all generated by using the Si material, the absorption layer is generated by using a Ge material, and the gradient layer is generated by using a silicon germanium (SiGe) material.

If the first charge layer, the second charge layer, the first multiplication layer, and the second multiplication layer are all generated by using an InAlAs material or an InP material, the substrate layer and the buffer layer are generated by using the InP material, the diffusion barrier layer is generated by using the InAlAs material or the InP material, the contact layer is generated by using an indium gallium arsenide InGaAs material or an indium gallium phosphate (InGaAsP) material, the absorption layer is generated by using an InGaAs material, and the gradient layer is generated by using an indium arsenide aluminum gallium (InAl-GaAs) material or an InGaAsP material.

Based on any one of the foregoing possible implementations of the first aspect, in a thirteenth possible implementation of the first aspect, if the buffer layer includes the first buffer layer and the second buffer layer, and the substrate layer is generated by using the InP material, the first buffer layer is generated by using the InP material, and the second buffer layer is generated by using the InAlAs material.

The multiplication layer is generated by using the InAlAs material or the Si material, and electric field distribution of the APD is optimized. In this way, electric field strength of the absorption layer is relatively low, and a tunneling dark current of the APD may be suppressed. Moreover, the electric field strength of the first multiplication layer is moderate, and a problem of avalanche tunneling in advance may be prevented.

According to a second aspect, an APD fabrication method is provided. The method includes generating a first buffer layer on a heavily doped substrate layer using a metalorganic chemical vapor deposition (MOCVD) technology; growing a second buffer layer, a second multiplication layer, a second charge layer, a first multiplication layer, and a first charge layer on the first buffer layer in sequence; growing a gradient layer on the first charge layer; growing an absorption layer on the gradient layer; growing a diffusion barrier layer on the absorption layer; growing a contact layer on the diffusion barrier layer; performing annular etching on the contact layer; growing a silicon dioxide (SiO2) film through plasma-enhanced chemical vapor deposition (PECVD), etching a window on the SiO2 film, and performing Zn diffusion; generating an anti-reflective coating on the diffusion barrier layer; performing SiO2 masking growth in sequence, and etching to the substrate layer; growing a bisbenzocyclobutane (BCB) passivation layer based on each etched layer; fabricating a second electrode of titanium, platinum or aurum materials with an electron beam evaporation method, and performing annealing after vapor deposition; and thinning the substrate layer, fabricating a first electrode using a sputtering technology, and performing annealing after sputtering.

According to a third aspect, a detector is provided. The detector includes: a control circuit and the APD according to any one of the first aspect. The control circuit and the APD are configured to convert a received echo pulse into an electrical signal used for imaging.

According to a fourth aspect, a laser radar system is provided. The laser radar system includes a laser, a transmitter optical module, a receiver optical module, a detector, and a signal processing unit. The detector includes the APD according to any one of the first aspect.

The laser transmits a laser pulse to a target object by using the transmitter optical module.

The receiver optical module receives an echo pulse. The echo pulse is obtained by reflecting the laser pulse after the laser pulse is irradiated on the target object.

The detector converts the echo pulse into an electrical signal.

The signal processing unit obtains, based on the electrical signal, a point cloud image corresponding to the target object.

It can be understood that, for beneficial effects of the second to fourth aspects, reference may be made to related description in the first aspect. Details are not described herein again.

BRIEF DESCRIPTION OF DRAWINGS

FIG. 11 is a schematic diagram of a technological process of APD fabrication according to an embodiment of this application;

FIG. 14 is a schematic diagram of another technological process of APD fabrication according to an embodiment of this application.

DESCRIPTION OF EMBODIMENTS

In the following descriptions, for illustration instead of limitation, details including a system structure, a technology, and the like are provided to make a thorough understanding of embodiments of this application. However, a person skilled in the art should know that this application may also be implemented in other embodiments without these details. In other cases, detailed descriptions of a well-known APD, an APD fabrication method, a detector, and a laser radar system are omitted, to prevent unnecessary details from obscuring descriptions of this application.

Terms used in the following embodiments are only intended to describe embodiments, but are not intended to limit this application. The terms "one", "the", "the foregoing", and "this" of singular forms used in this specification and the appended claims of this application are also intended to include expressions such as "one or more", unless otherwise specified in the context clearly.

Figure 1:
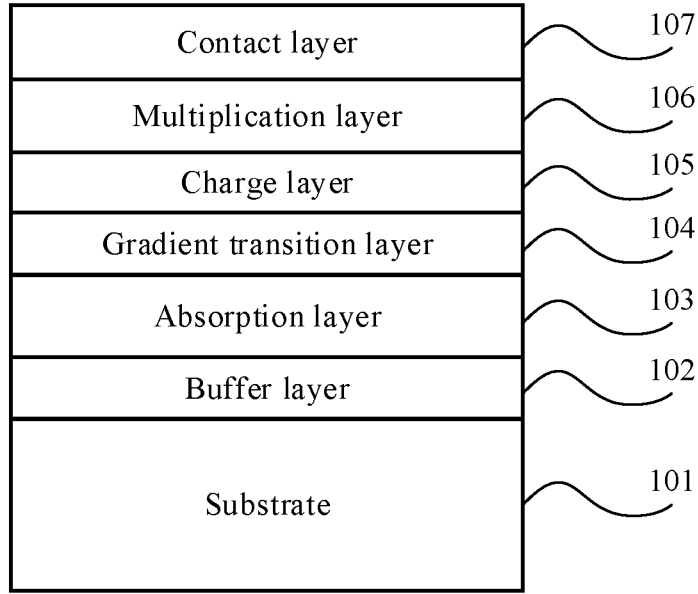
FIG. 1 is a schematic diagram of a structure of an APD in the conventional technology.
Figure 2:
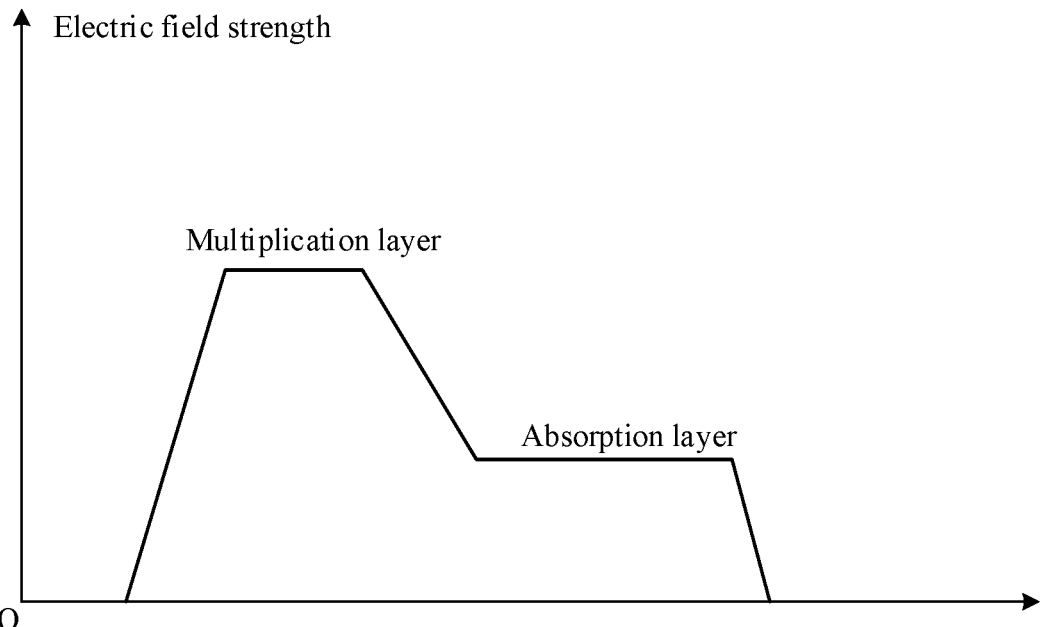
FIG. 2 is a schematic diagram of distribution of electric field strength inside an APD in the conventional technology.
Figure 3:
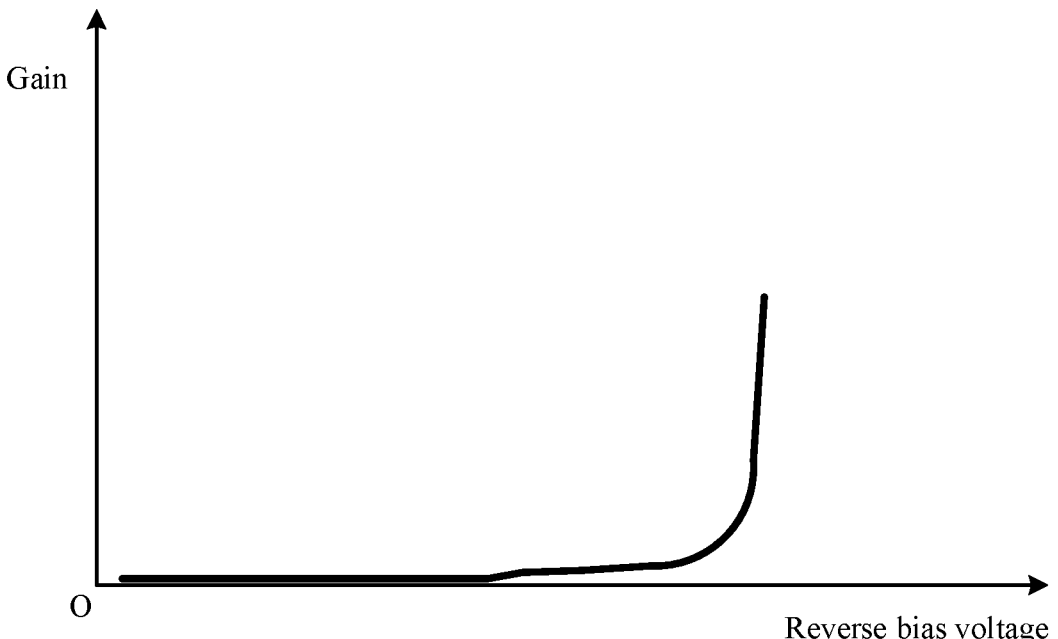
FIG. 3 is a diagram of a gain curve of an APD in the conventional technology.
Figure 4:
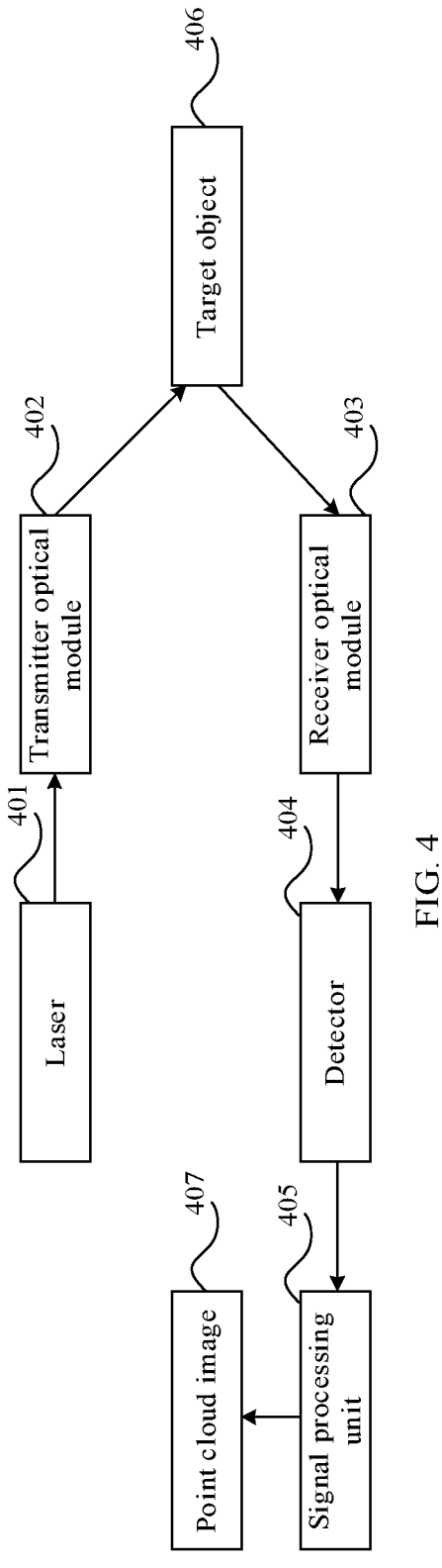
FIG. 4 is a schematic diagram of an architecture of a laser radar system according to an embodiment of this application.

First, a laser radar system related to an APD provided in an embodiment of this application is described. The laser radar system shown in FIG. 4 may include: a laser 401, a transmitter optical module 402, a receiver optical module 403, a detector 404, and a signal processing unit 405.

In an example, the laser 401 may transmit a high-power laser pulse. After passing through the transmitter optical module 402, the laser pulse reaches a detected target object 406. The laser pulse is irradiated on the target object 406 for reflection, to form an echo pulse. The receiver optical module 403 may receive the echo pulse, and feedback the echo pulse to the detector 404. The detector 404 may convert the received echo pulse into an electrical signal, and then send the electrical signal that is obtained by conversion, to the signal processing unit 405. The signal processing unit 405 may perform point cloud data analysis based on the electrical signal, and determine a distance between the laser radar system and the target object 406 and strength information of the target object 406 through a time difference between a moment at which the laser pulse is transmitted and a moment at which the echo pulse is received, to obtain a three-dimensional (3D) point cloud image 407 of the target object 406.

The laser radar system can accurately draw a 3D environment map with precision of a centimeter level, and may be widely applied to fields including vehicle assistance, automatic driving, robot positioning and navigation, mobile phone three-dimensional imaging, spatial environment mapping, security protection, and the like.

The detector 404 may include a control circuit and an APD. The control circuit and the APD are configured to convert a received echo pulse into an electrical signal used for imaging. As an important sensor of machine three-dimensional vision, APD can endow an electronic device with a more accurate and efficient environment scene capture capability. The APD can be gradually popularized in fields of future smart terminal including mobile phones, smart homes, industrial robots, and the like. For example, in addition to being applied to the field of laser radars, the APD in this application may be further applied to various fields including laser detection, imaging, and the like.

The APD may be classified into different types of APDs by different carriers. For example, the APD may include an electron-type APD and an electron hole-type APD.

The following first describes an electron-type APD.

Figure 5:
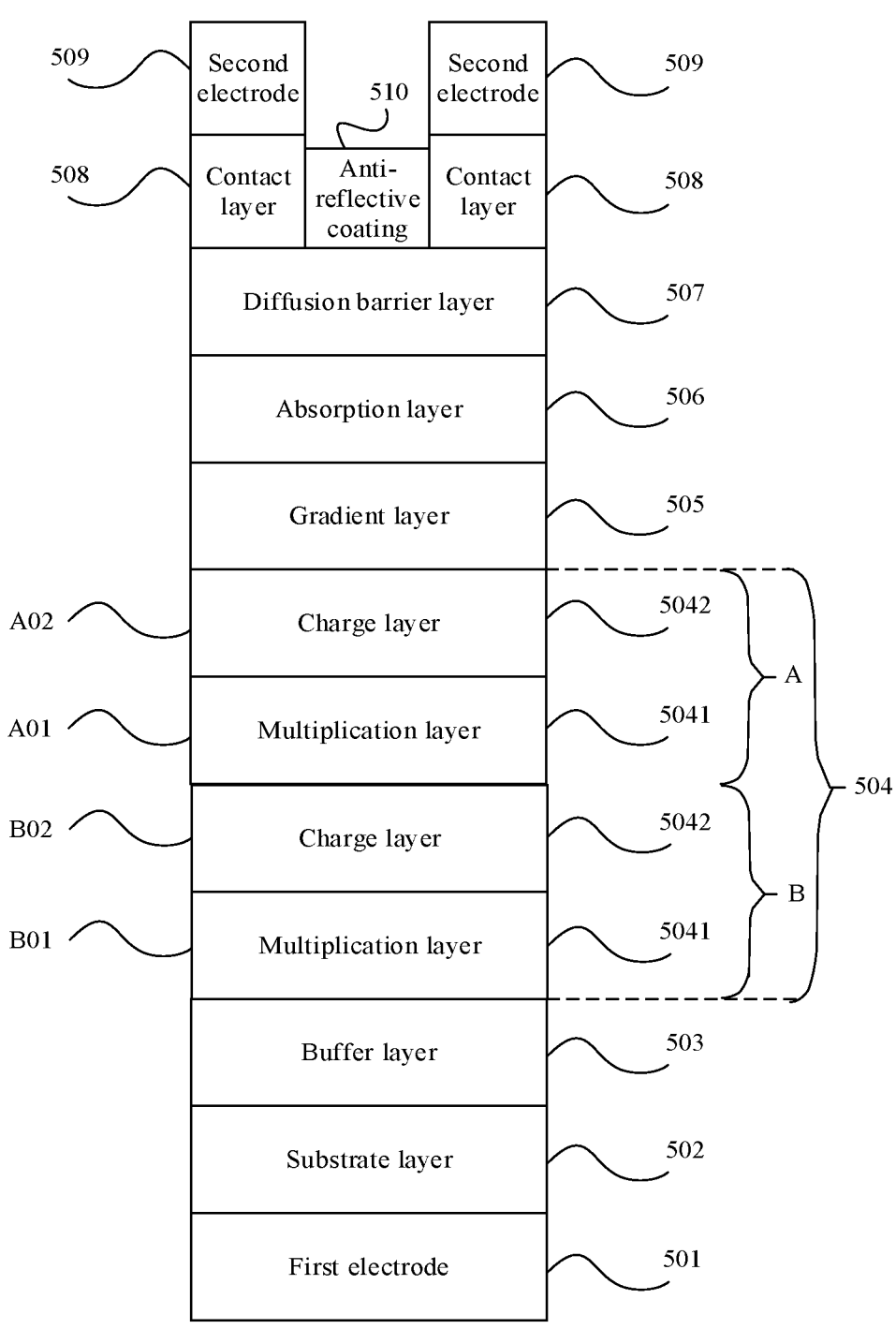
FIG. 5 is a sectional view of an APD according to an embodiment of this application.

FIG. 5 is a sectional view of an APD. From bottom to top, the APD may include: a first electrode 501, a substrate layer 502, a buffer layer 503, a gain layer 504, a gradient layer 505, an absorption layer 506, a diffusion barrier layer 507, a contact layer 508, and a second electrode 509.

The contact layer 508 and the second electrode 509 are of an annular structure.

Referring to FIG. 5, in addition, the APD may further include an anti-reflective coating 510. The anti-reflective coating 510 is located on a side that is of the diffusion barrier layer 507 and that is close to the second electrode 509. The anti-reflective coating 510 is located in the annular structure formed by the contact layer 508 and the second electrode 509.

The anti-reflective coating 510 is configured to reduce or eliminate reflected light on a surface of the APD, thereby increasing a transmittance of light entering the diffusion barrier layer 507 of the APD.

Figure 6:
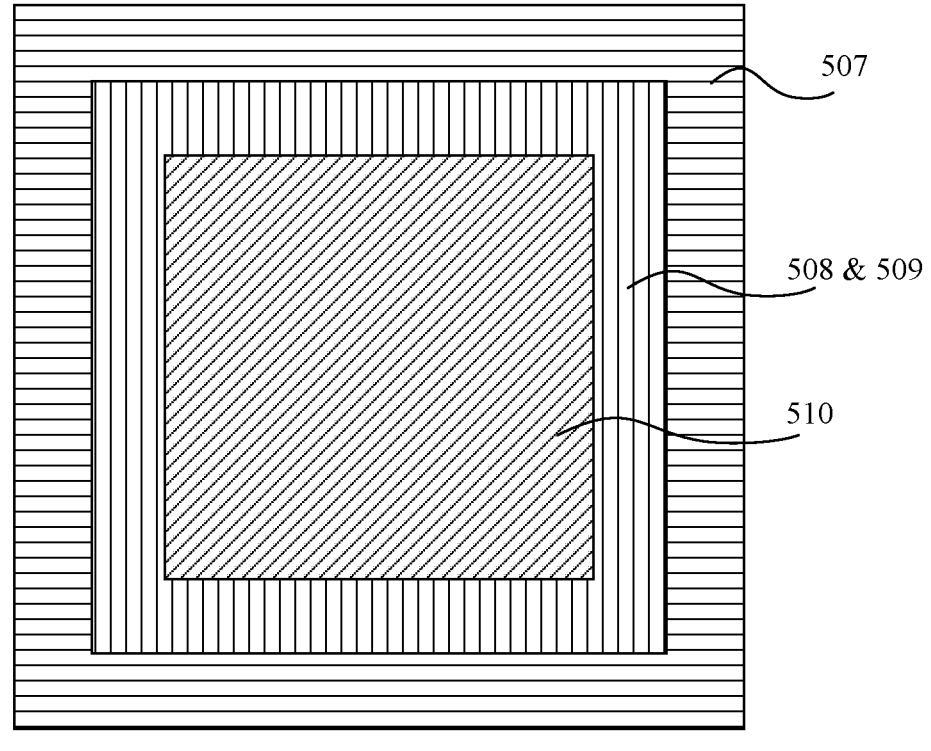
FIG. 6 is a top view of an APD according to an embodiment of this application.

FIG. 6 is a top view of an APD. It can be seen that the second electrode 509 is of an annular structure. With reference to the APD structure shown in FIG. 5, the contact layer 508 is also of an annular structure. A projection of the contact layer 508 on the diffusion barrier layer 507 coincides with a projection of the second electrode 509 on the diffusion barrier layer 507. The anti-reflective coating 510 covers the diffusion barrier layer 507. The anti-reflective coating 510 is located in the annular structure formed by the contact layer 508 and the second electrode 509. In addition, an edge of the anti-reflective coating 510 is in contact with the contact layer 508, or an edge of the anti-reflective coating 510 is in contact with the contact layer 508 and the second electrode 509. A thickness of the anti-reflective coating 510 is not limited in this embodiment of this application.

Further, the gain layer 504 may include at least two gain units. Each of the gain units may include: a multiplication layer 5041 and a charge layer 5042. For each of the gain units, a distance between the charge layer 5042 and the gradient layer 505 that are in the gain unit is less than a distance between the multiplication layer 5041 and the gradient layer 505 that are in the gain unit. In addition, in a process in which an electron moves in the gain unit, the electron may flow from the charge layer 5042 to the multiplication layer 5041.

In addition, a plurality of gain units in the gain layer 504 may be arranged in a stacked manner. That is, the gain layer 504 may include a plurality of multiplication layers 5041 and a plurality of charge layers 5042. A quantity of the multiplication layers 5041 is consistent with a quantity of the charge layers 5042. The multiplication layers 5041 and the charge layers 5042 are alternately stacked.

Referring to FIG. 5, the gain layer 504 includes two gain units. It may be understood that FIG. 5 is merely an example, and is not intended to limit this application. A quantity of gain units is not limited in this embodiment of this application. For ease of description, the following uses FIG. 5 as an example for description.

In an example, the two gain units included in the gain layer 504 may be a first gain unit A and a second gain unit B. The second gain unit B and the gradient layer 505 are located on two sides of the first gain unit A. That is, a distance between the second gain unit B and the gradient layer 505 is greater than a distance between the first gain unit A and the gradient layer 505.

The first gain unit A may include a first multiplication layer A01 and a first charge layer A02. The second gain unit B may include a second multiplication layer B01 and a second charge layer B02. The first charge layer A02 is generated by using a p-type material. The second charge layer B02 is generated by using an n-type material. The first multiplication layer A01 and the second multiplication layer B01 are both generated by using an intrinsic material.

For example, the first charge layer A02 is generated by using a p-type indium arsenide InAlAs material or a p-type InP material, the second charge layer B02 is generated by using an n-type InAlAs material or an n-type InP material, and the first multiplication layer A01 and the second multiplication layer B01 are both generated by using an intrinsic InAlAs material or an intrinsic InP material. Alternatively, the first charge layer A02 is generated by using a p-type silicon Si material, the second charge layer B02 is generated by using an n-type Si material, and the first multiplication layer A01 and the second multiplication layer B01 are both generated by using an intrinsic Si material or an intrinsic Ge material.

In a working process of the APD, the first electrode 501 of the APD is connected to a high potential, the second electrode 509 of the APD is connected to a low potential, and the APD is reversely biased. Incident light is irradiated from a side on which the second electrode 509 is located to the first electrode 501. The light passes through the second electrode 509 and the contact layer 508 that are of the annular structure, to irradiate the diffusion barrier layer 507. The light arrives at the absorption layer 506. When electric field strength is relatively low, the absorption layer 506 absorbs the incident light to generate an electron hole pair. A photo-generated electron arrives at the first charge layer A02 through the gradient layer 505, and arrives at the first multiplication layer A01 under an action of an electric field of the first charge layer A02. In this way, the photo-generated electron entering the first multiplication layer A01 causes an avalanche multiplication effect, and more electron hole pairs are generated. Then, the photo-generated electron and an electron generated by the avalanche multiplication effect may enter the second multiplication layer B01 under an action of an electric field of the second charge layer B02. However, an avalanche multiplication effect caused at the second multiplication layer B01 is clamped, so that a gain flattening region of the APD may be formed.

There is a relatively large energy level difference between the absorption layer 506 and the first charge layer A02. There is a relatively small energy level difference between the gradient layer 505 and the absorption layer 506. There is a relatively small energy level difference between the gradient layer 505 and the first charge layer A02. Therefore, carrier hysteresis caused by discontinuous energy bands between the absorption layer 506 and the first charge layer A02 may be alleviated by the gradient layer 505.

In addition, doping concentrations and integral charge density of the first charge layer A02 and the second charge layer B02 may be adjusted to make electric field strength of the first charge layer A02 greater than electric field strength of the second charge layer B02 and make the electric field strength of the second charge layer B02 greater than the electric field strength of the absorption layer 506, so that internal electric field of the APD may be adjusted through the electric field strength of the first charge layer A02 and the second charge layer B02. In this way, each layer that is of the APD and that is depleted in a working state has appropriate electric field strength, to implement high-speed carrier drift. In addition, an excessively high electric field may be prevented from generating an excessively large dark current or generating a harmful avalanche multiplication effect.

Figure 7:
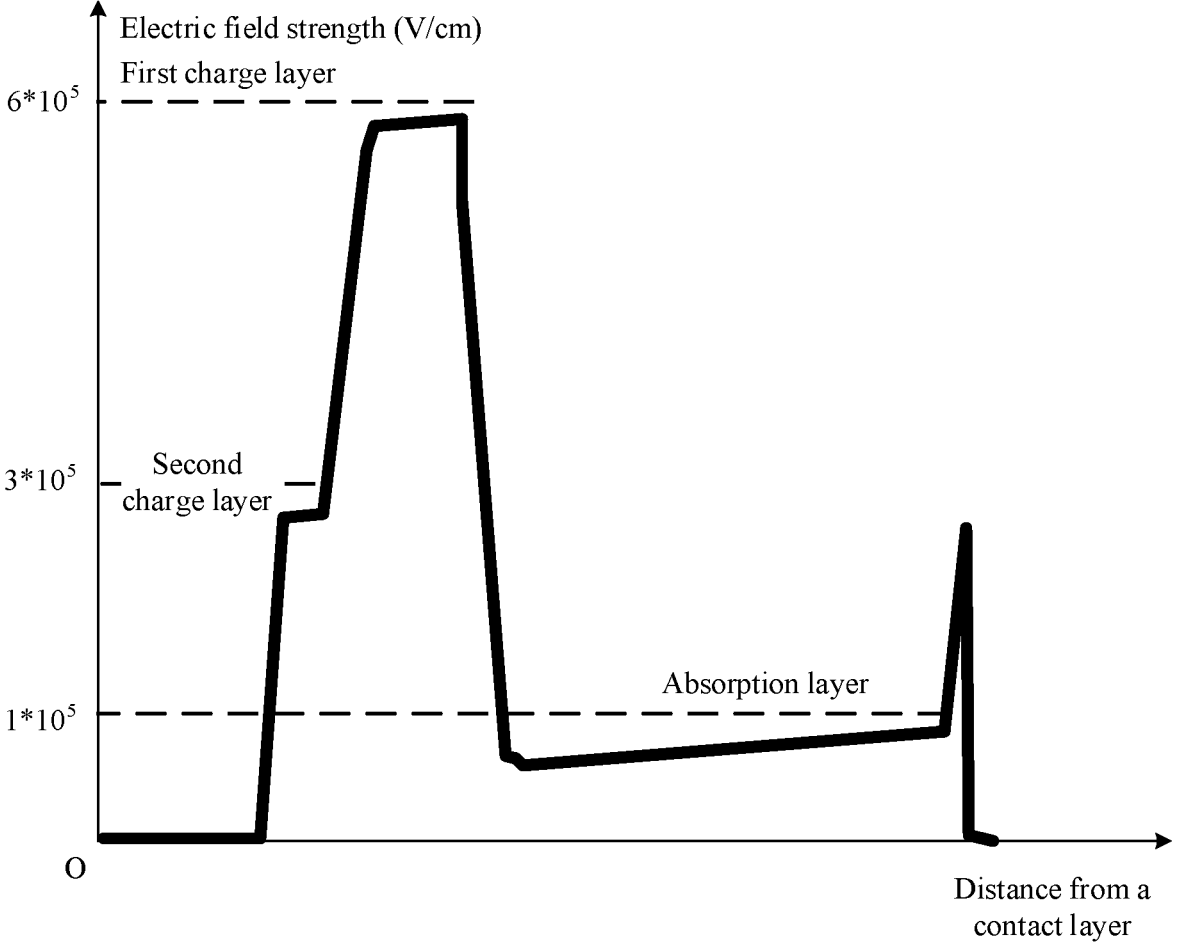
FIG. 7 is a curve diagram of electric field strength inside an APD according to an embodiment of this application.

For example, FIG. 7 shows an example of a curve of electric field strength inside an APD. By adjusting the doping concentrations and integral charge density of the first charge layer A02 and the second charge layer B02, it can be seen that the electric field strength of the second charge layer B02 is less than $3*10^5$ volts per centimeter (V/cm), the electric field strength of the first charge layer A02 is less than $6*10^5$ V/cm, and the electric field strength of the absorption layer 506 is less than $1*10^5$ V/cm. In addition, the electric field strength of the first charge layer A02 is greater than the electric field strength of the second charge layer B02. The electric field strength of the second charge layer B02 is greater than the electric field strength of the absorption layer 506.

In addition, the second multiplication layer B01 may interact with the first multiplication layer A01 by adding the second multiplication layer B01, so that a gain of the APD is adjusted, and the APD may form a gain flattening region in a high-gain region, thereby reducing impact of a temperature on performance of the APD.

Figure 8:
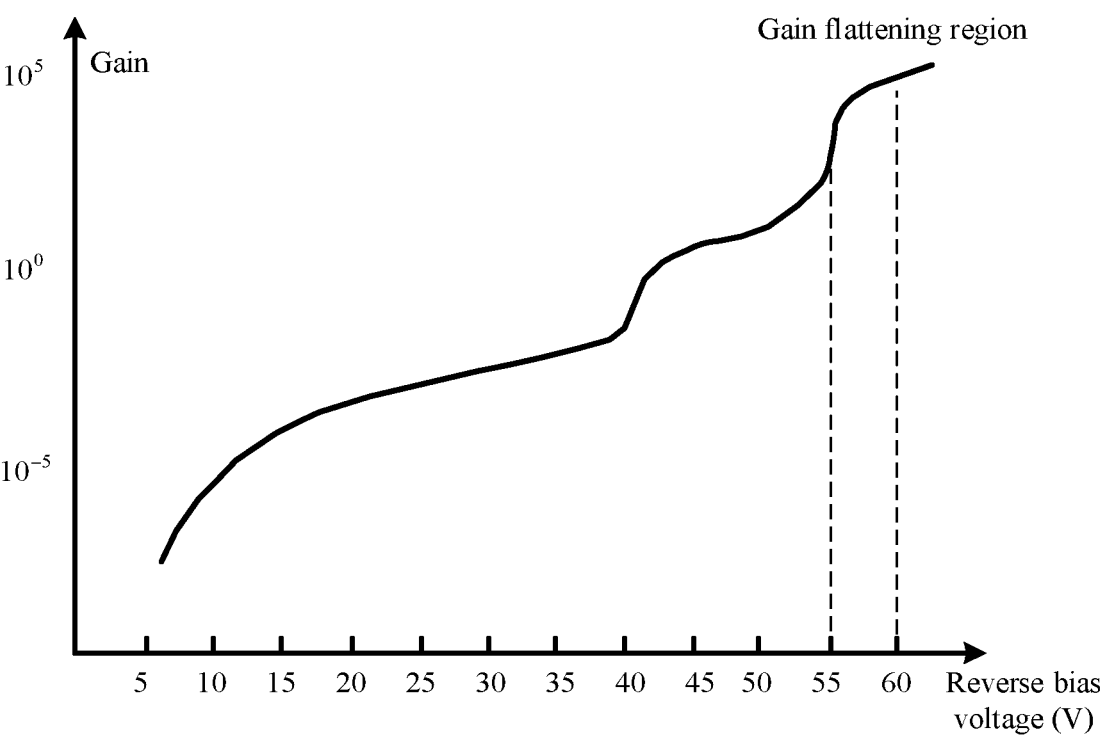
FIG. 8 is a diagram of a gain curve of an APD according to an embodiment of this application.

For example, FIG. 8 shows a gain curve of an APD. In a process of a voltage from 0 volts (V) to 55 V, the gain of the APD also increases continuously. However, in a phase of a voltage from 55 V to 60 V, a slope of the gain curve decreases, and the gain flattening region appears.

Further, the gain of the APD may be adjusted based on the doping concentration of the second charge layer B02. When the doping concentration of the second charge layer B02 gradually increases, a range of the gain flattening region of the APD in the high-gain region gradually increases. This indicates that the higher the doping concentration of the second charge layer B02, the larger the range of the gain flattening region of the APD.

For example, FIG. 9A, FIG. 9B, FIG. 9C, and FIG. 9D show that the APD presents gain flattening regions with different ranges when the second charge layer B02 has different doping concentrations. The doping concentrations of the second charge layer B02 corresponding to FIG. 9A,

10

Figure 9A:
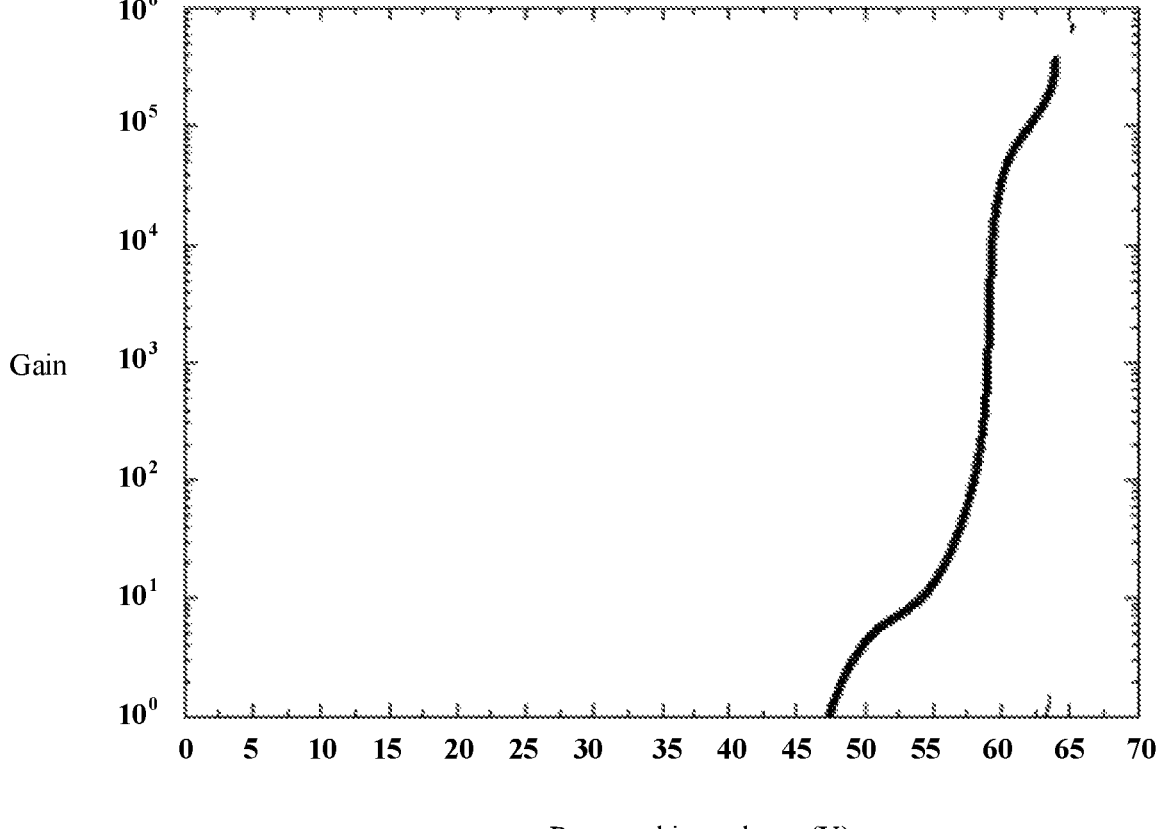
FIG. 9A is a diagram of a gain curve of another APD according to an embodiment of this application.
Figure 9B:
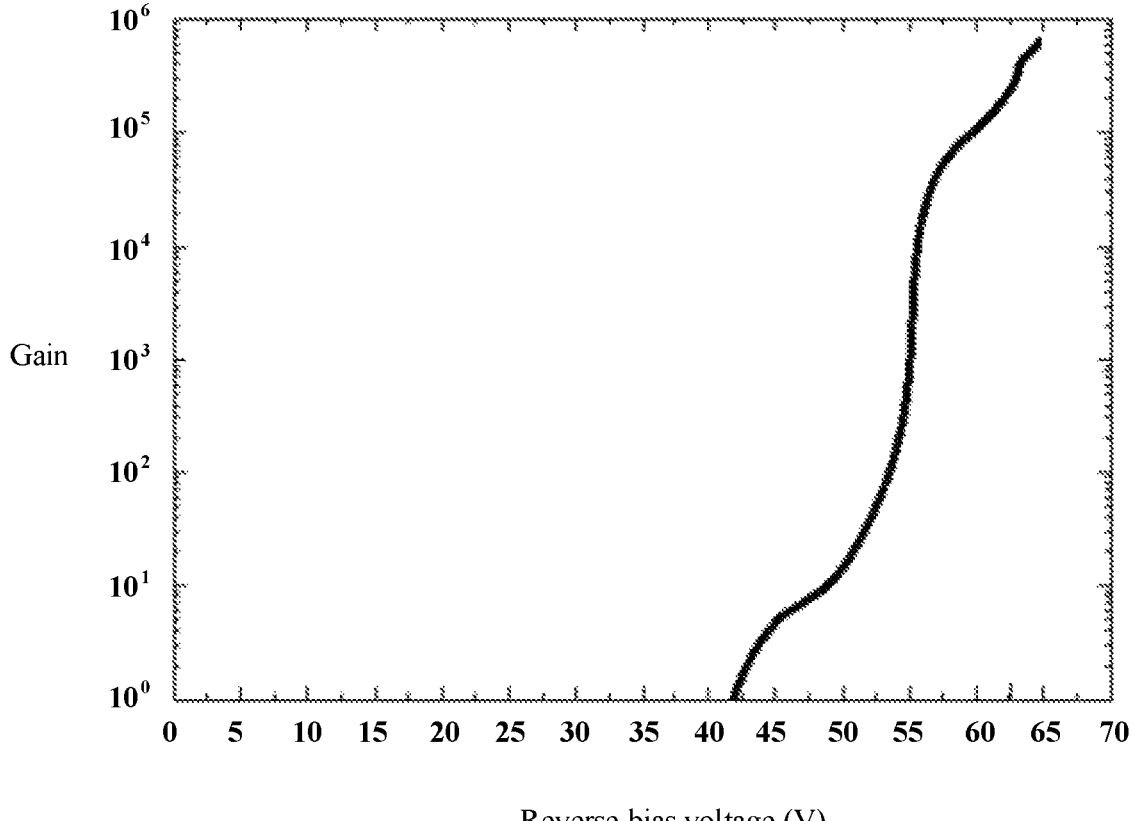
FIG. 9B is a diagram of a gain curve of still another APD according to an embodiment of this application.
Figure 9C:
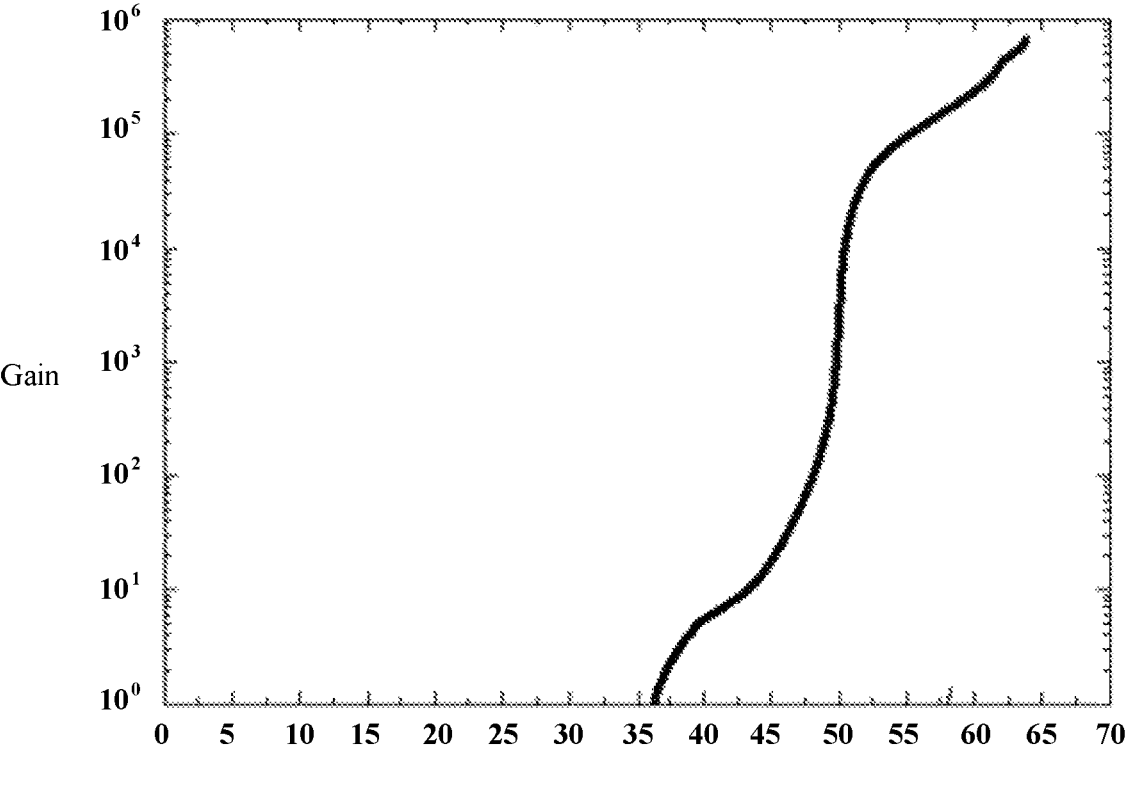
FIG. 9C is a diagram of a gain curve of still another APD according to an embodiment of this application.
Figure 9D:
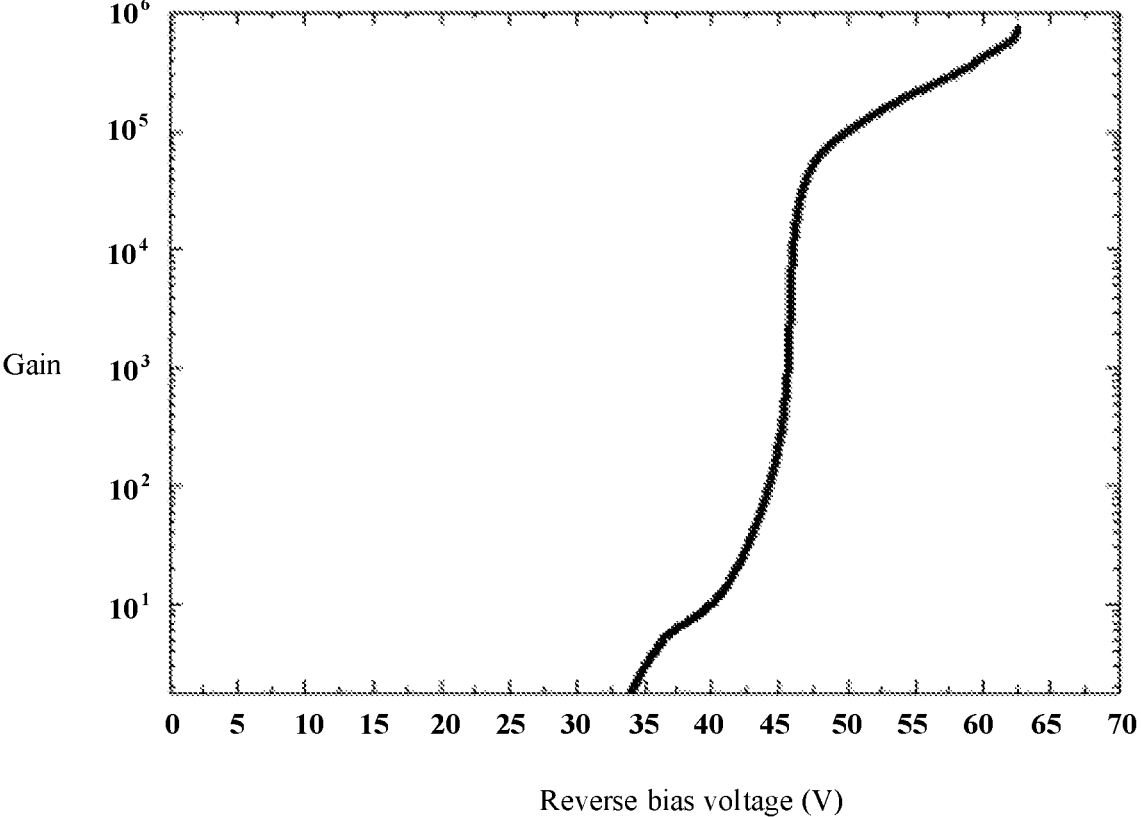
FIG. 9D is a diagram of a gain curve of still another APD according to an embodiment of this application.

FIG. 9B, FIG. 9C, and FIG. 9D are $6*10^{16}$ per cubic centimeter ($/cm^3$), $8*10^{16}/cm^3$, $12*10^{16}/cm^3$, and $24*10^{16}/cm^3$, respectively. Correspondingly, the ranges of the gain flattening regions correspond to 60 V to 63 V, 57 V to 63 V, 53 V to 64 V, and 46 V to 64 V, respectively.

Figure 10:
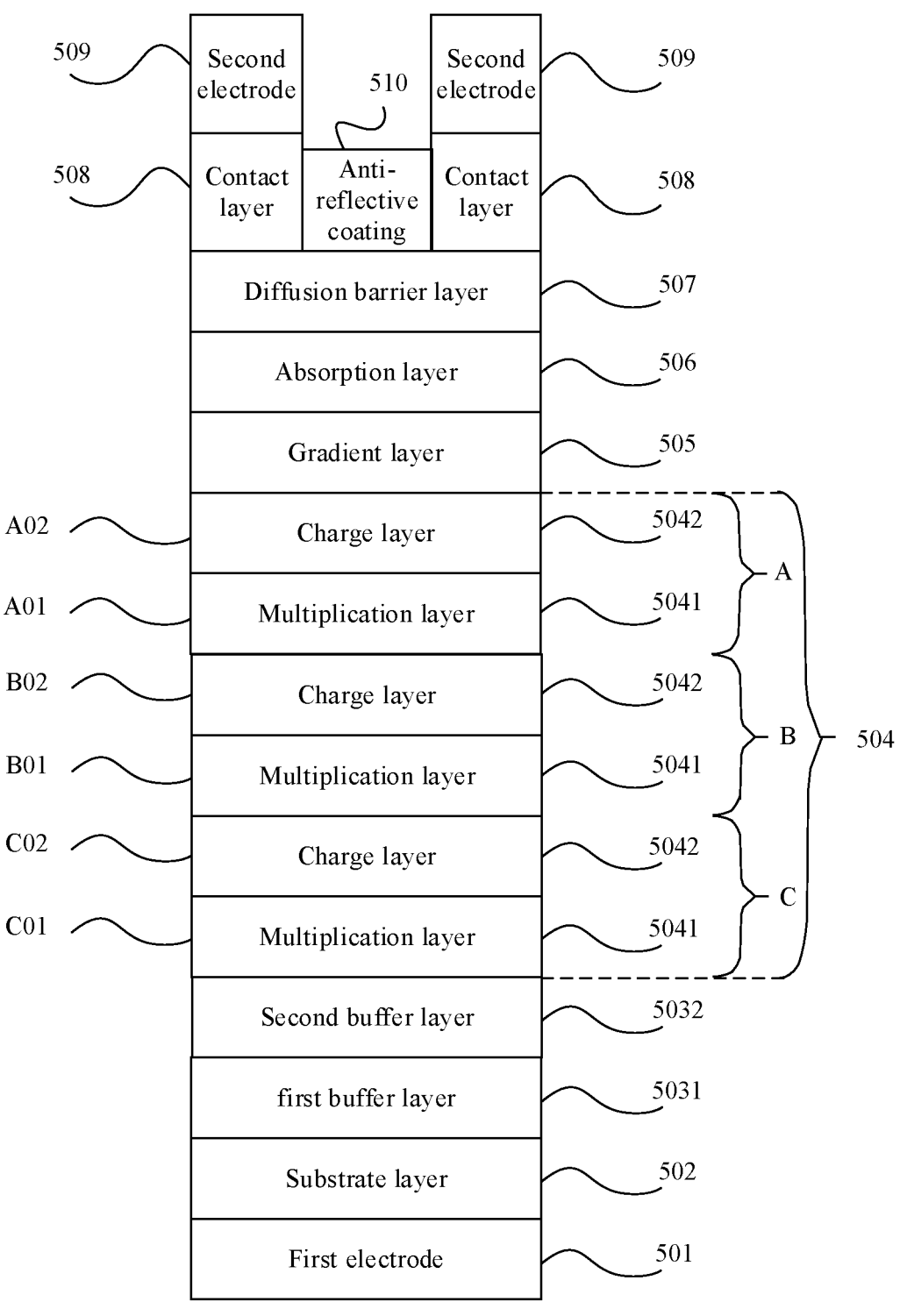
FIG. 10 is a sectional view of another APD according to an embodiment of this application.

Referring to FIG. 10, in this embodiment of this application, the buffer layer 503 may include: a first buffer layer 5031 and a second buffer layer 5032. The second buffer layer 5032 and the substrate layer 502 are located on two sides of the first buffer layer 5031. That is, a distance between the first buffer layer 5031 and the substrate layer 502 is less than a distance between the second buffer layer 5032 and the substrate layer 502.

A material of the first buffer layer 5031 is inconsistent with a material of the second buffer layer 5032, and the material of the first buffer layer 5031 is consistent with a material of the substrate layer 502. In this way, a defect may be reduced by lattice match between the first buffer layer 5031 and the substrate layer 502. The second buffer layer 5032 is configured to eliminate a memory effect of the substrate layer 502 and the first buffer layer 5031 in a growth process, so that the second multiplication layer B01 may grow better.

The foregoing embodiment is described by using an example in which the gain layer 504 includes two gain units. The following describes a case in which the gain layer 504 includes three gain units. Referring to FIG. 10, the gain layer 504 may further include a third gain unit C. In addition, the third gain unit C and the first gain unit A are located on two sides of the second gain unit B. That is, a distance between the third gain unit C and the first gain unit A is greater than a distance between the second gain unit B and the first gain unit A.

Similar to the first gain unit A and the second gain unit B, the third gain unit C may include a third multiplication layer C01 and a third charge layer C02. The third multiplication layer C01 is generated by using the intrinsic material, and the third charge layer C02 is generated by using the n-type material.

It should be noted that, if the APD includes a plurality of gain units, except the charge layers included in the first gain unit and the second gain unit, all charge layers included in other gain units are n-type doped. That is, all the charge layers included in the other gain units are generated by using the n-type material.

The APD in this embodiment of this application may be generated by using a material such as InAlAs, or may be generated by using materials such as Si and Ge. This is not limited in this embodiment of this application.

FIG. 11 is a schematic diagram of a technological process of APD fabrication. An APD generated by using a material such as InAlAs is fabricated. The APD includes the first buffer layer 5031 and the second buffer layer 5032. A fabrication process may include the following steps:

S1: Generate an n-type first buffer layer 5031 on a heavily doped n-type InP substrate layer 502 using a MOCVD technology.

The first buffer layer 5031 is generated by using an InP material. A range of a thickness of the first buffer layer 5031 may be 50 nanometers (nm) to 2,000 nm. A range of a doping concentration of the first buffer layer 5031 may be $1*e^{17}/cm^3$ to $1*e^{19}/cm^3$. For example, the thickness of the first buffer layer 5031 may be 200 nm, and the doping concentration may be $1*e^{18}/cm^3$.

S2: Grow a heavily doped n-type second buffer layer 5032, an intrinsic second multiplication layer B01, an n-type second charge layer B02, an intrinsic first multiplication layer A01, and a p-type first charge layer A02 in sequence on the first buffer layer 5031.

The second buffer layer 5032 is generated by using an n-type $In_{0.52}Al_{0.48}As$ material. A range of a thickness of the second buffer layer 5032 may be 30 nm to 2,000 nm. A range of a doping concentration of the second buffer layer 5032 may be $1*e^{17}/cm^3$ to $1*e^{19}/cm^3$. The second multiplication layer B01 is generated by using an intrinsic $In_{0.52}Al_{0.48}As$ material. A range of a thickness of the second multiplication layer B01 may be 80 nm to 400 nm. The second charge layer B02 is generated by using an n-type $In_{0.52}Al_{0.48}As$ material. Integral charge density of the second charge layer B02 is $2.4*e^{12}$ per square centimeter $(/cm^2)$ to $4.8*e^{12}/cm^2$. The first multiplication layer A01 is generated by using an intrinsic $In_{0.52}Al_{0.48}As$ material. A range of a thickness of the first multiplication layer A01 may be 100 nm to 600 nm. The first charge layer A02 is generated by using a p-type $In_{0.52}Al_{0.48}As$ material. Integral charge density of the first charge layer A02 is from $2.4*e^{12}/cm^2$ to $4.8*e^{12}/cm^2$.

For example, the thickness of the second buffer layer 5032 may be 500 nm, and the doping concentration may be $1*e^{18}/cm^3$. The thickness of the second multiplication layer B01 may be 200 nm, and the thickness of the first multiplication layer A01 may be 400 nm.

S3: Grow an intrinsic InAlGaAs gradient layer 505 on the first charge layer A02.

A range of a thickness of the gradient layer 505 may be 10 nm to 100 nm. For example, the thickness of the gradient layer 505 may be 60 nm.

S4: Grow an intrinsic $In_{0.53}Ga_{0.47}As$ absorption layer 506 on the gradient layer 505.

A range of a thickness of the absorption layer 506 may be 0.5 micrometers (μm) to 2.5 μm. For example, the thickness of the absorption layer 506 may be 2.0 μm.

S5: Grow a p-type InP diffusion barrier layer 507 on the absorption layer 506.

A range of a thickness of the diffusion barrier layer 507 may be 0.2 μm to 2.0 μm, and a doping concentration or a diffusion concentration may be $1*e^{18}/cm^3$ to $3*e^{18}/cm^3$. For example, the thickness of the diffusion barrier layer 507 may be 1.0 μm, and the doping concentration or the diffusion concentration may be $1*e^{18}/cm^3$.

S6: Grow a p-type $In_{0.53}Ga_{0.47}As$ contact layer 508 on the diffusion barrier layer 507.

A range of a thickness of the contact layer 508 may be 20 nm to 200 nm, and a doping concentration or a diffusion concentration may be $1*e^{18}/cm^3$ to $1*e^{19}/cm^3$. For example, the thickness of the contact layer 508 may be 100 nm, and the doping concentration or the diffusion concentration may be $1*e^{18}/cm^3$.

S7: Perform annular etching on the contact layer 508.

S8: Grow a $SiO_2$ film by PECVD, etch a window on the $SiO_2$ film, and perform Zn diffusion.

S9: Generate a silicon nitride (SiN) anti-reflective coating 510 on the diffusion barrier layer 507.

S10: Perform $SiO_2$ masking growth in sequence, and etch the APD to the substrate layer 502.

S11: Grow a BCB passivation layer based on each etched layer, to protect a table surface formed through etching.

S12: Fabricate a p-type second electrode 509 with a titanium (Ti), platinum (Pt) or aurum (Au) material by using an electron beam evaporation method, and perform annealing after vapor deposition.

The second electrode 509 is an ohmic contact electrode.

S13: Thin a substrate, fabricate an n-type first electrode 501 using a sputtering technology, and perform annealing after sputtering.

The first electrode 501 is an ohmic contact electrode.

Figure 12:
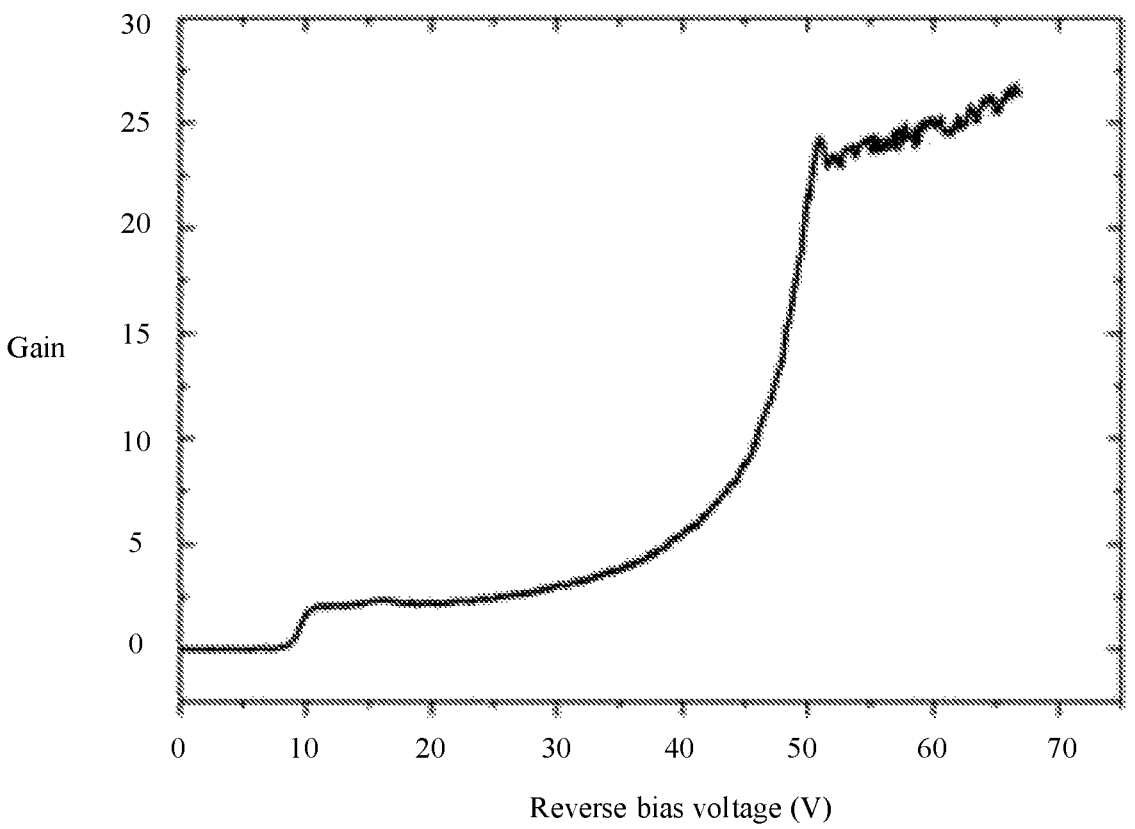
FIG. 12 is a diagram of a gain curve of still another APD according to an embodiment of this application.

An experiment is performed based on the fabricated APD, and an experiment result of the gain and a reverse bias voltage of the APD is obtained, as shown in FIG. 12. Referring to FIG. 12, when the reverse bias voltage ranges from 50 V to 70 V, the slope of the gain curve decreases obviously, and the gain of the APD is greater than 25.

It should be noted that the foregoing technological process merely describes various materials for generating the APD as an example. In actual application, the substrate layer 502 and the buffer layer 503 are generated by using the n-type material, the gradient layer 505 and the absorption layer 506 are generated by using the intrinsic material, and the diffusion barrier layer 507 and the contact layer 508 are generated by using the p-type material. In addition, the diffusion barrier layer 507 may be generated by using a wide-band gap and heavily doped material. The contact layer 508 may be generated by using a narrow-band gap and heavily doped material.

For example, if the first charge layer A02, the second charge layer B02, the first multiplication layer A01, and the second multiplication layer B01 are all generated by using an InAlAs material or an InP material, the substrate layer 502 and the buffer layer 503 are generated by using the InP material, the diffusion barrier layer 507 is generated by using the InAlAs material or the InP material, the contact layer 508 is generated by using an indium gallium arsenide InGaAs material or an InGaAsP material, the absorption layer is generated by using an InGaAs material, and the gradient layer 505 is generated by using an InAlGaAs material or an InGaAsP material.

Alternatively, if the first charge layer A02 and the second charge layer B02 are both generated by using a Si material, and the first multiplication layer A01 and the second multiplication layer B01 are both generated by using the intrinsic Si material or the intrinsic Ge material, the substrate layer 502, the buffer layer 503, the diffusion barrier layer 507, and the contact layer 508 are all generated by using the Si material, the absorption layer 506 is generated by using a Ge material, and the gradient layer 505 is generated by using a SiGe material.

A technological process of fabricating an APD generated by using materials such as Si and Ge is similar to the foregoing technological process of fabricating an APD generated by using materials such as InAlAs, and is not further described herein.

The first charge layer A02, the diffusion barrier layer 507, and the contact layer 508 are all generated by using a p-type Si material. The second charge layer B02, the substrate layer 502, and the buffer layer 503 are all generated by using the n-type Si material. The first multiplication layer A01 and the second multiplication layer B01 are all generated by using the intrinsic Si material. The absorption layer 506 is generated by using the intrinsic Ge material. The gradient layer 505 is generated by using an intrinsic SiGe material.

Correspondingly, a range of a thickness of the buffer layer 503 may be 30 nm to 2,000 nm, and a doping concentration of the buffer layer 503 may be $1*e^{18}$ to $8*e^{18}/cm^3$. The range of the thickness of the second multiplication layer B01 may be 100 nm to 500 nm, and a range of the integral charge density of the second charge layer B02 may be $1.2*e^{21}/cm^2$ to $3.0*e^{12}/cm^2$. The range of the thickness of the first multiplication layer A01 may be 100 nm to 600 nm. A range of the integral charge density of the first charge layer A02 is $1.2*e^{12}/cm^2$ to $3.0*e^{12}/cm^2$. The range of the thickness of the gradient layer 505 may be 30 nm to 200 nm. The range of the thickness of the absorption layer 506 may be 0.5 μm to 2.0 µm. The range of the thickness of the diffusion barrier layer 507 may be 0.2 µm to 2.0 µm, and the doping concentration or the diffusion concentration may be $1*e^{18}/cm^3$ to $1*e^{19}/cm^3$. The range of the thickness of the contact layer 508 may be 20 nm to 200 nm, and the doping concentration or the diffusion concentration may be $1*e^{18}/cm^3$ to $1*e^{19}/cm^3$.

In conclusion, the APD provided in this embodiment of this application is an APD that includes the first electrode, the substrate layer, the buffer layer, the gain layer, the gradient layer, the absorption layer, the diffusion barrier layer, the contact layer, the second electrode, and the like. The p-type doped first charge layer and the n-type doped second charge layer may implement precise control over the electric field inside the APD and the gain of the APD. In combination with control over the thickness of the first multiplication layer, this may effectively increase the gain of the APD. Electric field strength of the first multiplication layer and electric field strength of the second multiplication layer are then controlled, so that the electric field strength of the second multiplication layer is less than the electric field strength of the first multiplication layer. The gain flattening region of the APD may be formed. Therefore, temperature stability of the APD can be improved, temperature drift of the APD can be reduced, a gain change degree of the APD when a temperature changes can be reduced, and reliability of the APD can be improved.

In addition, the multiplication layer is generated by using the InAlAs material or the Si material, and electric field distribution of the APD is optimized. In this way, electric field strength of the absorption layer is relatively low, and a tunneling dark current of the APD may be suppressed. Moreover, the electric field strength of the first multiplication layer is moderate, and a problem of avalanche tunneling in advance may be prevented.

The following then describes an electron hole-type APD.

Figure 13:
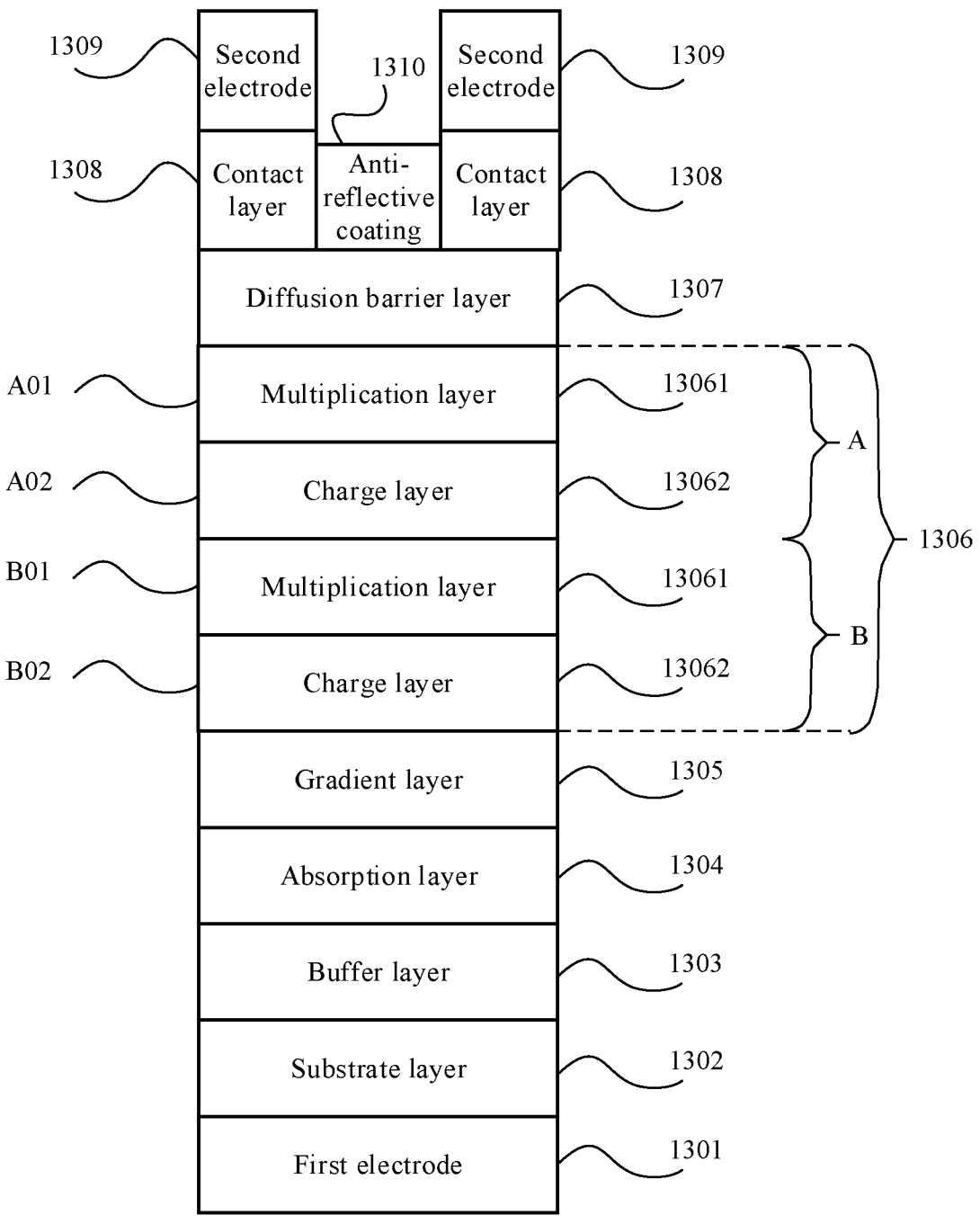
FIG. 13 is a sectional view of still another APD according to an embodiment of this application.

FIG. 13 is a sectional view of an APD. From bottom to top, the APD may include: a first electrode 1301, a substrate layer 1302, a buffer layer 1303, an absorption layer 1304, a gradient layer 1305, a gain layer 1306, a diffusion barrier layer 1307, a contact layer 1308, and a second electrode 1309.

Referring to FIG. 13, in addition, the APD may further include an anti-reflective coating 1310. The anti-reflective coating 1310 is located on a side that is of the diffusion barrier layer 1307 and that is close to the second electrode 1309. The anti-reflective coating 1310 is located in the annular structure formed by the contact layer 1308 and the second electrode 1309.

In addition, the gain layer 1306 may include at least two gain units. Each of the gain units may include: a multiplication layer 13061 and a charge layer 13062. For each of the gain units, a distance between the charge layer 13062 and the gradient layer 1305 that are in the gain unit is less than a distance between the multiplication layer 13061 and the gradient layer 1305 that are in the gain unit. In addition, in a process in which an electron moves in the gain unit, an electron hole may flow from the multiplication layer 13061 to the charge layer 13062.

An example in which the gain layer 1306 includes two gain units is used for description. Referring to FIG. 13, the gain layer 1306 may include a first gain unit A and a second gain unit B. The second gain unit B and the gradient layer 1305 are located on two sides of the first gain unit A. That is, a distance between the second gain unit B and the gradient layer 1305 is less than a distance between the first gain unit A and the gradient layer 1305.

The first gain unit A may include a first multiplication layer A01 and a first charge layer A02. The second gain unit B may include a second multiplication layer B01 and a second charge layer B02. The first charge layer A02 and the second charge layer B02 are both generated by using an n-type material. The first multiplication layer A01 and the second multiplication layer B01 are both generated by using an intrinsic material.

For example, the first charge layer A02 and the second charge layer B02 are both generated by using an n-type InAlAs material or an n-type InP material, and the first multiplication layer A01 and the second multiplication layer B01 are both generated by using an intrinsic InAlAs material or an intrinsic InP material. Alternatively, the first charge layer A02 and the second charge layer B02 are both generated by using an n-type Si material, and the first multiplication layer A01 and the second multiplication layer B01 are both generated by using an intrinsic Si material or an intrinsic Ge material.

In addition, to form a gain flattening region of the APD, a thickness of the second multiplication layer B01 may be increased. For example, a range of the thickness of the second multiplication layer B01 may be 200 nm to 1,000 nm, or even exceed 1,000 nm. This is not limited in this embodiment of this application.

It should be noted that another structure of the APD shown in FIG. 13 is similar to the structure of the APD shown in FIG. 5. Details are not described herein again.

The APD in this embodiment of this application may be generated by using a material such as InP, or may be generated by using another material. This is not limited in this embodiment of this application.

FIG. 14 shows a schematic diagram of another technological process of APD fabrication. An APD generated by using a material such as InP is fabricated by using the process shown in FIG. 14. A fabrication process may include the following steps:

S1: Generate an n-type buffer layer 1303 on the substrate layer 1302 using an MOCVD technology.

The buffer layer 1303 is generated by using an InP material. A range of a thickness of the first buffer layer 1303 may be 50 nm to 2,000 nm. A range of a doping concentration of the buffer layer 1303 may be $1*e^{18}/cm^3$ to $8*e^{18}/cm^3$. For example, the thickness of the buffer layer 1303 may be 200 nm, and the doping concentration may be $1*e^{18}/cm^3$.

S2: Grow an intrinsic $In_{0.53}Ga_{0.47}As$ absorption layer 1304 on the buffer layer 1303.

A range of a thickness of the absorption layer 1304 may be 0.2 µm to 2.5 µm. For example, the thickness of the absorption layer 1304 may be 2.0 µm.

S3: Grow an intrinsic InGaAsP gradient layer 1305 on the absorption layer 1304.

A range of a thickness of the gradient layer 1305 may be 10 nm to 200 nm. For example, the thickness of the gradient layer 1305 may be 60 nm.

S4: Grow an n-type second charge layer B02, an intrinsic second multiplication layer B01, an n-type first charge layer A02, and an intrinsic first multiplication layer A01 in sequence on the gradient layer 1305.

The second charge layer B02 is generated by using the n-type InP material, and integral charge density of the second charge layer B02 is $1.8*e^{12}/cm^2$ to $3.5*e^{12}/cm^2$. The second multiplication layer B01 is generated by using the intrinsic InP material, and the range of the thickness of the second multiplication layer B01 may be 100 nm to 500 nm. The first charge layer A02 is generated by using the n-type InP material, and integral charge density of the first charge layer A02 is $1.8*e^{12}/cm^2$ to $3.5*e^{12}/cm^2$. The first multiplication layer A01 is generated by using the intrinsic InP material, and a range of a thickness of the first multiplication layer A01 may be 100 nm to 600 nm.

For example, the thickness of the second multiplication layer B01 may be 200 nm, and the thickness of the first multiplication layer A01 may be 400 nm.

S5: Grow a p-type InP diffusion barrier layer 1307 on the first multiplication layer A01.

A range of a thickness of the diffusion barrier layer 1307 may be 0.2 μm to 2.0 μm, and a doping concentration or a diffusion concentration may be $1*e^{18}/cm^3$ to $3*e^{19}/cm^3$. For example, the thickness of the diffusion barrier layer 1307 may be 1.0 μm, and the doping concentration or the diffusion concentration may be $1*e^{18}/cm^3$.

S6: Grow a p-type $In_{0.53}Ga_{0.47}As$ contact layer 1308 on the diffusion barrier layer 1307.

A range of a thickness of the contact layer 1308 may be 20 nm to 200 nm, and a doping concentration or a diffusion concentration may be $1*e^{18}/cm^3$ to $1*e^{19}/cm^3$. For example, the thickness of the contact layer 1308 may be 100 nm, and the doping concentration or the diffusion concentration may be $1*e^{18}/cm^3$.

S7: Perform annular etching on the contact layer 1308.

S8: Grow a $SiO_2$ film through PECVD, etch a window on the $SiO_2$ film, and perform Zn diffusion.

S9: Generate a SiN anti-reflective coating 1310 on the diffusion barrier layer 1307.

S10: Perform $SiO_2$ masking growth in sequence, and etch the APD to the substrate layer 1302.

S11: Grow a BCB passivation layer based on each etched layer, to protect a table surface formed through etching.

S12: Fabricate a p-type second electrode 1309 with a Ti, Pt or Au material by using an electron beam evaporation method, and perform annealing after vapor deposition.

The second electrode 1309 is an ohmic contact electrode.

S13: Thin a substrate, fabricate an n-type first electrode 1301 using a sputtering technology, and perform annealing after sputtering.

The first electrode 1301 is an ohmic contact electrode.

It should be noted that the foregoing technological process merely describes various materials for generating the APD as an example. In actual application, the substrate layer 1302 and the buffer layer 1303 are generated by using the n-type material, the gradient layer 1305 and the absorption layer 1304 are generated by using the intrinsic material, and the diffusion barrier layer 1307 and the contact layer 1308 are generated by using the p-type material. In addition, the diffusion barrier layer 1307 may be generated by using a wide-band gap and heavily doped material. The contact layer 1308 may be generated by using a narrow-band gap and heavily doped material.

For example, if the first charge layer, the second charge layer, the first multiplication layer, and the second multiplication layer are all generated by using an InAlAs material or an InP material, the substrate layer 1302 and the buffer layer 1303 are generated by using the InP material, the diffusion barrier layer 1307 is generated by using the InAlAs material or the InP material, the contact layer 1308 is generated by using an indium gallium arsenide InGaAs material or an InGaAsP material, the absorption layer is generated by using an InGaAs material, and the gradient layer 1305 is generated by using an InAlGaAs material or an InGaAsP material.

Alternatively, if the first charge layer and the second charge layer are both generated by using a silicon Si material, and the first multiplication layer and the second multiplication layer are both generated by using the intrinsic Si material or the intrinsic germanium Ge material, the substrate layer 1302, the buffer layer 1303, the diffusion barrier layer 1307, and the contact layer 1308 are all generated by using the Si material, the absorption layer 1304 is generated by using a Ge material, and the gradient layer 1305 is generated by using a silicon germanium (SiGe) material.

In conclusion, the APD provided in this embodiment of this application is an APD that includes the first electrode, the substrate layer, the buffer layer, the gain layer, the gradient layer, the absorption layer, the diffusion barrier layer, the contact layer, the second electrode, and the like. The n-type doped first charge layer and the second charge layer may implement precise control over the electric field inside the APD and the gain of the APD. In combination with control over the thickness of the first multiplication layer, this may effectively increase the gain of the APD. Electric field strength of the first multiplication layer and electric field strength of the second multiplication layer are then controlled, so that the electric field strength of the second multiplication layer is less than the electric field strength of the first multiplication layer. The gain flattening region of the APD may be formed. Therefore, temperature stability of the APD can be improved, temperature drift of the APD can be reduced, a gain change degree of the APD when a temperature changes can be reduced, and reliability of the APD can be improved.

A person skilled in the art can clearly understand that, for the purpose of convenient and brief description, division of the foregoing functional units and modules is merely used as an example for illustration. During actual application, the foregoing functions may be allocated to different functional units and modules for implementation as required. That is, an inner structure of the apparatus is divided into different functional units or modules to implement all or some of the functions described above. The functional units and modules in the embodiments may be integrated into one processing unit, or each unit may be individually and physically present, or two or more units may be integrated into one unit. The integrated unit described above may be implemented in the form of hardware, or may be implemented in the form of software functional units. In addition, the names of the functional units and modules are only for the convenience of distinguishing from each other, and are not used to limit the protection scope of this application. For a working process of the units and modules the foregoing system, refer to the corresponding process in the foregoing method embodiments. Details are not described herein again.

In the foregoing embodiments, the description of each embodiment has respective focuses. For a part that is not described in detail or recorded in an embodiment, refer to related descriptions in other embodiments.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraints of the technical solutions. A skilled person may use different methods for particular applications to implement the described functions, but this implementation should not be considered as beyond the scope of this application.

In the embodiments provided in this application, it should be understood that the disclosed apparatus and method may be implemented in other manners. For example, the described system embodiment is merely an example. For example, division of the modules or units is merely logical function division, and there may be another division manner in actual implementation. For example, a plurality of units or components may be combined or may be integrated into another system, or some features may be ignored or not be performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of embodiments.

In addition, functional units in the embodiments of this application may be integrated into one processing unit, each of the units may exist alone physically, or two or more units are integrated into one unit. The integrated unit may be implemented in a form of hardware, or may be implemented in a form of a software functional unit.

When the integrated unit is implemented in the form of the software functional unit and sold or used as an independent product, the integrated unit may be stored in a computer-readable storage medium. Based on such an understanding, all or some of the procedures of the method in the embodiments of this application may be implemented by a computer program instructing related hardware. The computer program may be stored in a computer-readable storage medium. When the computer program is executed by a processor, the steps in the foregoing method embodiments may be implemented. The computer program includes computer program code. The computer program code may be in a source code form, an object code form, an executable file form, some intermediate forms, or the like. The computer-readable medium may include at least any entity or apparatus that can carry computer program code to the APD, a recording medium, a computer memory, a read-only memory (ROM), a random-access memory (RAM), an electrical carrier signal, a telecommunication signal, and a software distribution medium, for example, a USB flash drive, a removable hard disk, a magnetic disk, or an optical disc. In some jurisdictions, the computer-readable medium cannot be the electrical carrier signal or the telecommunication signal according to legislation and patent practices.

In conclusion, the foregoing descriptions are merely implementations of this application, and are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. An avalanche photodiode (APD), comprising:
a first electrode layer;
a substrate layer disposed on the first electrode layer;
a buffer layer disposed on the substrate layer;
a gain layer disposed above the buffer layer and comprising:
  a first gain unit comprising:
    a first multiplication layer; and
    a first charge layer disposed on the first multiplication layer; and a second gain unit comprising:
    a second multiplication layer disposed on the first charge layer; and
    a second charge layer disposed on the second multiplication layer;
  a gradient layer disposed a first distance above the second charge layer and a second distance above the second multiplication layer, wherein the first distance is less than the second distance;
  an absorption layer disposed on the gradient layer;
  a diffusion barrier layer disposed on the absorption layer;
  a contact layer disposed on the diffusion barrier layer; and
  a second electrode layer disposed on the contact layer.

2. The APD of claim 1, wherein a third distance between the gain layer and the buffer layer is less than a fourth distance between the gradient layer and the buffer layer.

3. The APD of claim 2, wherein a fifth distance between the second gain unit and the gradient layer is greater than a sixth distance between the first gain unit and the gradient layer.

4. The APD of claim 3, wherein the first charge layer is based on a p-type indium arsenide (InAlAs) material or a p-type indium phosphide (InP) material, wherein the second charge layer is based on an n-type InAlAs material or an n-type InP material, wherein the first multiplication layer and the second multiplication layer are both based on an intrinsic InAlAs material or an intrinsic InP material, or wherein the first charge layer is based on a p-type silicon (Si) material, wherein the second charge layer is based on an n-type Si material, and wherein the first multiplication layer and the second multiplication layer are both based on an intrinsic Si material or an intrinsic germanium (Ge) material.

5. The APD of claim 1, wherein a third distance between the gain layer and the buffer layer is greater than a fourth distance between the gradient layer and the buffer layer.

6. The APD of claim 5, wherein a fifth distance between the second gain unit and the gradient layer is less than a sixth distance between the first gain unit and the gradient layer.

7. The APD of claim 6, wherein the first charge layer and the second charge layer are both based on an n-type InAlAs material or an n-type InP material, and wherein the first multiplication layer and the second multiplication layer are both based on an intrinsic InAlAs material or an intrinsic InP material; or wherein the first charge layer and the second charge layer are both based on an n-type Si material, and wherein the first multiplication layer and the second multiplication layer are both based on an intrinsic Si material or an intrinsic Ge material.

8. The APD of claim 3, further comprising a third gain unit comprising a third multiplication layer and a third charge layer, wherein a seventh distance between the third gain unit and the first gain unit is greater than a eighth distance between the second gain unit and the first gain unit, wherein the third charge layer is based on an n-type material, and wherein the third multiplication layer is based on an intrinsic material.

9. The APD of claim 1, wherein the contact layer and the second electrode layer are of an annular structure, wherein the contact layer comprises a first projection on the diffusion barrier layer, wherein the second electrode layer comprises a second projection on the diffusion barrier layer, and wherein the first projection coincides with the second projection.

10. The APD of claim 1, further comprising an anti-reflective coating disposed on the diffusion barrier layer, wherein the contact layer and the second electrode layer are of an annular structure, wherein the contact layer comprises a first projection on the diffusion barrier layer, wherein the second electrode layer comprises a second projection on the diffusion barrier layer, wherein the first projection coincides with the second projection.

11. The APD of claim 1, wherein the buffer layer comprises a first buffer layer and a second buffer layer, wherein a third distance between the first buffer layer and the substrate layer is less than a fourth distance between the second buffer layer and the substrate layer, wherein the first buffer layer comprises a first material, and wherein the second buffer layer comprises the first material.

12. The APD of claim 1, wherein the substrate layer and the buffer layer are based on an n-type material, wherein the gradient layer and the absorption layer are based on an intrinsic silicon (Si) material or an intrinsic germanium (Ge) material, and wherein the diffusion barrier layer and the contact layer are based on a p-type material.

13. A detector, comprising:

an avalanche photodiode (APD), comprising:
  a first electrode layer;
  a substrate layer disposed on the first electrode layer;
  a buffer layer disposed on the substrate layer;
  a gain layer disposed above the buffer layer and comprising:
    a first gain unit comprising:
      a first multiplication layer; and
      a first charge layer disposed on the first multiplication layer; and
    a second gain unit comprising:
      a second multiplication layer disposed on the first charge layer; and
      a second charge layer disposed on the second multiplication layer;
  a gradient layer disposed a first distance above the second charge layer and a second distance above the second multiplication layer, wherein the first distance is less than the second distance;
  an absorption layer disposed on the gradient layer;
  a diffusion barrier layer disposed on the absorption layer;
  a contact layer disposed on the diffusion barrier layer; and
  a second electrode layer disposed on the contact layer; and a control circuit coupled to the APD and configured to receive an electrical signal from the detector for imaging.

14. The detector of claim 13, wherein a third distance between the gain layer and the buffer layer is less than a fourth distance between the gradient layer and the buffer layer.

15. The detector of claim 14, wherein a fifth distance between the second gain unit and the gradient layer is greater than a sixth distance between the first gain unit and the gradient layer.

16. The detector of claim 15, wherein the first charge layer is based on a p-type indium arsenide (InAlAs) material or a p-type indium phosphide (InP) material, wherein the second charge layer is based on an n-type InAlAs material or an n-type InP material, and wherein the first multiplication layer and the second multiplication layer are both based on an intrinsic InAlAs material or an intrinsic InP material; or wherein the first charge layer is based on a p-type silicon (Si)

material, wherein the second charge layer is based on an n-type Si material, and wherein the first multiplication layer and the second multiplication layer are both based on an intrinsic Si material or an intrinsic germanium Ge material.

17. The detector of claim 13, wherein a third distance between the gain layer and the buffer layer is greater than a fourth distance between the gradient layer and the buffer layer.

18. The detector of claim 17, wherein a fifth distance between the second gain unit and the gradient layer is less than a sixth distance between the first gain unit and the gradient layer.

19. The detector of claim 18, wherein the first charge layer and the second charge layer are both based on an n-type InAlAs material or an n-type InP material, wherein the first multiplication layer and the second multiplication layer are both based on an intrinsic InAlAs material or an intrinsic InP material; or wherein the first charge layer and the second charge layer are both based on an n-type Si material, and wherein the first multiplication layer and the second multiplication layer are both based on an intrinsic Si material or an intrinsic Ge material.

20. A laser radar system, comprising:
  a transmitter optical module;
  a laser configured to transmit a laser pulse on a target object using the transmitter optical module;
  a receiver optical module configured to receive an echo pulse, wherein the echo pulse is a reflected signal of the laser pulse from the target object;
  a detector comprising an avalanche photodiode (APD), wherein the detector is configured to convert the echo pulse into an electrical signal, and wherein the APD comprises:
    a first electrode layer;
    a substrate layer disposed on the first electrode layer;
    a buffer layer disposed on the substrate layer;
    a gain layer disposed above the buffer layer and comprising:
      a first gain unit comprising:
        a first multiplication layer; and
        a first charge layer disposed on the first multiplication layer; and
      a second gain unit comprising:
        a second multiplication layer disposed on the first charge layer; and
        a second charge layer disposed on the second multiplication layer;
    a gradient layer disposed a first distance above the second charge layer and a second distance above the second multiplication layer, wherein the first distance is less than the second distance;
    an absorption layer disposed on the gradient layer;
    a diffusion barrier layer disposed on the absorption layer;
    a contact layer disposed on the diffusion barrier layer; and
    a second electrode layer disposed on the contact layer; and
  a signal processor coupled to the detector and configured to obtain, based on the electrical signal, a point cloud image corresponding to the target object.

* * * * *